United States Patent
Jeon et al.

(12)

(10) Patent No.: US 10,761,390 B2
(45) Date of Patent: Sep. 1, 2020

(54) LIQUID CRYSTAL DISPLAY DEVICE AND METHOD FOR FABRICATING THE SAME

(71) Applicant: SAMSUNG DISPLAY CO., LTD., Yongin-si, Gyeonggi-do (KR)

(72) Inventors: Youngjae Jeon, Daejeon (KR); Hyunseong Kang, Cheonan-si (KR); Youhan Moon, Asan-si (KR); Beomsoo Park, Hanam-si (KR); Jaehyun Park, Yongin-si (KR); Il You, Seoul (KR); Sangju Lee, Seoul (KR); Jaeho Choi, Asan-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 16/021,119

(22) Filed: Jun. 28, 2018

(65) Prior Publication Data

US 2018/0314089 A1    Nov. 1, 2018

Related U.S. Application Data

(63) Continuation of application No. 15/149,255, filed on May 9, 2016, now Pat. No. 10,042,225.

(30) Foreign Application Priority Data

May 11, 2015    (KR) .................. 10-2015-0065461

(51) Int. Cl.
*G02F 1/1368* (2006.01)
*G02F 1/1362* (2006.01)
(Continued)

(52) U.S. Cl.
CPC ...... *G02F 1/1368* (2013.01); *G02F 1/133345* (2013.01); *G02F 1/134363* (2013.01);
(Continued)

(58) Field of Classification Search
CPC .................................................. G02F 1/1368
See application file for complete search history.

(56) References Cited

U.S. PATENT DOCUMENTS

| | | | |
|---|---|---|---|
| 6,091,466 A | 7/2000 | Kim et al. | |
| 2003/0085404 A1* | 5/2003 | Kim ................... | G02F 1/13458 257/72 |

(Continued)

FOREIGN PATENT DOCUMENTS

| | | |
|---|---|---|
| KR | 1020000061175 | 10/2000 |
| KR | 1020050047387 | 5/2005 |
| KR | 1020070104090 | 10/2007 |

*Primary Examiner* — Sang V Nguyen
(74) *Attorney, Agent, or Firm* — F. Chau & Associates, LLC

(57) ABSTRACT

An LCD device includes first and second substrates and a liquid crystal layer disposed between the substrates. A gate transmitting member is disposed on the first substrate. The gate transmitting member includes a gate line and a gate electrode. A data transmitting member is disposed on the first substrate. The data transmitting member includes a data line, a source electrode, and a drain electrode. A pixel electrode is disposed in a pixel area. The pixel electrode is connected to the source electrode. A first gate insulating layer is disposed on the gate transmitting member. The first gate insulating layer has substantially a same shape as the gate transmitting member and has a greater size than a size of the gate transmitting member. A semiconductor layer is disposed on the first gate insulating layer. The semiconductor layer overlaps the gate electrode, the source electrode, and the drain electrode.

20 Claims, 38 Drawing Sheets

(51) Int. Cl.
  *H01L 29/423* (2006.01)
  *H01L 27/12* (2006.01)
  *G02F 1/1333* (2006.01)
  *G02F 1/1343* (2006.01)

(52) U.S. Cl.
  CPC ...... *G02F 1/136286* (2013.01); *H01L 27/124* (2013.01); *H01L 27/1248* (2013.01); *H01L 27/1288* (2013.01); *H01L 29/42384* (2013.01); *G02F 2001/134372* (2013.01)

(56) References Cited

U.S. PATENT DOCUMENTS

| | | | |
|---|---|---|---|
| 2006/0081849 A1* | 4/2006 | Lee | H01L 27/283 257/72 |
| 2006/0274012 A1 | 12/2006 | Hong et al. | |
| 2007/0012926 A1* | 1/2007 | Hong | H01L 27/12 257/72 |
| 2008/0003726 A1* | 1/2008 | Park | H01L 27/1214 438/149 |
| 2009/0026445 A1* | 1/2009 | Noh | H01L 51/0541 257/40 |
| 2009/0057666 A1* | 3/2009 | Shih | G02F 1/13458 257/59 |
| 2009/0109134 A1 | 4/2009 | Kim et al. | |
| 2011/0310341 A1* | 12/2011 | Kim | G02F 1/134363 349/140 |
| 2014/0055440 A1 | 2/2014 | Cho et al. | |
| 2014/0147976 A1* | 5/2014 | Shim | G03F 1/38 438/158 |
| 2014/0176894 A1* | 6/2014 | Park | G02F 1/134363 349/143 |
| 2014/0354924 A1* | 12/2014 | Byun | G02F 1/133514 349/106 |
| 2015/0056795 A1* | 2/2015 | Kang | H01L 21/28008 438/585 |
| 2015/0293417 A1* | 10/2015 | Lim | G02F 1/136204 361/56 |
| 2016/0179229 A1* | 6/2016 | Ahn | G06F 3/041 345/173 |
| 2016/0282666 A1* | 9/2016 | Ro | G02F 1/13454 |
| 2016/0334657 A1 | 11/2016 | Jeon et al. | |
| 2017/0069759 A1* | 3/2017 | Zang | H01L 29/7853 |

\* cited by examiner

LIQUID CRYSTAL DISPLAY DEVICE AND METHOD FOR FABRICATING THE SAME

CROSS-REFERENCE TO RELATED APPLICATION

This application is a continuation of U.S. patent application Ser. No. 15/149,255, filed on May 9, 2016, which claims priority under 35 U.S.C. § 119 to Korean Patent Application No. 10-2015-0065461, filed on May 11, 2015, in the Korean Intellectual Property Office (KIPO), the disclosure of which is incorporated by reference herein in its entirety.

1. TECHNICAL FIELD

Exemplary embodiments of the present invention relate to a liquid crystal display ("LCD") device, and more particularly to a method of fabricating the LCD device.

2. DISCUSSION OF RELATED ART

LCD devices are a type of flat panel display ("FPD") devices that have found a wide range of applications. An LCD device may include two substrates including electrodes formed on the substrates, and a liquid crystal layer disposed between the substrates. Upon applying a voltage to the electrodes, liquid crystal molecules of the liquid crystal layer may be rearranged, and thus the amount of transmitted light may be adjusted in the display device.

LCD devices may have a slim structure, but also may have relatively low side visibility compared to the front visibility, LCD devices in a plane to line switching ("PLS") mode, in which a pixel electrode and a common electrode are formed on a single substrate, may have a relatively wide viewing angle.

LCD devices in the PLS mode may be formed by a greater number of mask processes than the number of mask processes forming an LCD device in a twisted nematic ("TN") mode.

SUMMARY

Exemplary embodiments of the present invention may be directed to a liquid crystal display ("LCD") and a method of fabricating a gate transmitting member and a semiconductor layer together in a single mask process and fabricating a data transmitting member and a pixel electrode together in a single mask process, and to a method of fabricating the LCD device.

According to an exemplary embodiment of the present invention, a liquid crystal display device includes a first substrate and a second substrate. A liquid crystal layer is disposed between the first substrate and the second substrate. A gate transmitting member is disposed on the first substrate. The gate transmitting member includes a gate line and a gate electrode. A data transmitting member is disposed on the first substrate. The data transmitting member includes a data line, a source electrode, and a drain electrode. A pixel electrode is disposed in a pixel area. The pixel electrode is connected to the source electrode. A first gate insulating layer is disposed on the gate transmitting member. The first gate insulating layer has substantially a same shape as a shape of the gate transmitting member. The first gate insulating layer has a greater size than a size of the gate transmitting member. A semiconductor layer is disposed on the first gate insulating layer. The semiconductor layer overlaps the gate electrode, the source electrode, and the drain electrode.

The liquid crystal display device may include a dummy pattern disposed below the data line and below the drain electrode. The dummy pattern has substantially a same shape as shapes of the data line and the drain electrode, respectively.

The dummy pattern may be disposed on a same layer as a layer on which the pixel electrode is disposed.

A gap may be formed between the dummy pattern and the gate transmitting member.

The liquid crystal display device may include an ohmic contact layer disposed between the dummy pattern and the semiconductor layer and between the pixel electrode and the semiconductor layer, respectively.

The pixel electrode may include a connecting portion disposed below the drain electrode. The connecting portion may have substantially a same shape as a shape of the source electrode.

The liquid crystal display device may include a passivation layer disposed on the first substrate, the gate transmitting member, the first gate insulating layer, the semiconductor layer, the data transmitting member, the pixel electrode, and the gate insulating layer.

The liquid crystal display device may include a common electrode disposed on the passivation layer. The common electrode may overlap the pixel electrode. The common electrode may include a slit exposing a portion of the pixel electrode.

The common electrode may include an aperture exposing at least a portion of the gate electrode.

The liquid crystal display device may include a pad electrode disposed on a same layer as a layer on which the gate transmitting member is disposed in a non-display area of the first substrate. The pad electrode may be connected to the common electrode.

The liquid crystal display device may include a second gate insulating layer disposed between the pad electrode and the passivation layer. The second gate insulating layer may have substantially a same shape as a shape of the pad electrode. The second gate insulating layer may have a size greater than a size of the pad electrode.

A gap may be provided between the passivation layer and the pad electrode.

The liquid crystal display device may include a driving transistor disposed in the non-display area of the first substrate and a bridge electrode. The bridge electrode may connect a gate electrode of the driving transistor and a drain electrode of the driving transistor.

The gate electrode of the driving transistor may be disposed on a same layer as a layer on which the gate transmitting member is disposed. The drain electrode of the driving transistor may be disposed on a same layer as a layer on which the data transmitting member is disposed.

The liquid crystal display device may include a third gate insulating layer disposed between the gate electrode of the driving transistor and the passivation layer. The third gate insulating layer may have substantially a same shape as a shape of the gate electrode of the driving transistor. The third gate insulating layer may have a size greater than a size of the gate electrode of the driving transistor.

The liquid crystal display device may include a dummy drain electrode disposed between the drain electrode of the driving transistor and the first substrate.

According to an exemplary embodiment of the present invention, a method of fabricating a liquid crystal display device includes forming a gate material, an insulating material, a semiconductor material, and an ohmic contact material on a first substrate. A first photoresist pattern includes first and second patterns having different thickness from one another. The first photoresist is formed on the ohmic contact material. The first pattern has a smaller thickness than the second pattern. The ohmic contact material, the semiconductor material, and the insulating material are removed using the first photoresist pattern as a mask. The gate material is removed by an over-etching method using the first photoresist pattern as a mask. A gate transmitting member, a first gate insulating layer, a semiconductor material pattern, and a first ohmic contact material pattern are formed. The first pattern having a smaller thickness than the second pattern is removed. The second pattern is partially removed. The semiconductor material pattern and the first ohmic contact material pattern are removed using the second pattern of the first photoresist pattern as a mask. A semiconductor layer and a second ohmic contact material pattern are formed. A data transmitting member overlapping the semiconductor layer and a pixel electrode connected to the data transmitting member are formed.

The forming of the data transmitting member and the pixel electrode may include forming a pixel material and a data material on substantially an entire surface of the first substrate including the first gate insulating layer and the second ohmic contact material pattern. A second photoresist pattern may be formed on the data material. The second photoresist pattern may expose a channel region of the semiconductor layer. The second photoresist pattern may include third and fourth patterns having different thickness from one another. The third pattern has a smaller thickness than the fourth pattern. The pixel material and the data material may be removed using the second photoresist pattern as a mask. A dummy pattern, a pixel material pattern, a data line, a drain electrode, and a data material pattern may be formed. The third pattern having a smaller thickness than the fourth pattern is removed. The fourth pattern is partially removed. The data material may be removed using the fourth pattern of the second photoresist pattern as a mask. The pixel electrode and a source electrode may be formed.

The method may include removing the second ohmic contact material pattern in the channel region using the fourth pattern of the second photoresist pattern as a mask. An ohmic contact layer may be formed.

The method may include forming a passivation layer on substantially an entire surface of the first substrate including the gate transmitting member, the first gate insulating layer, the semiconductor layer, the data transmitting member, and the pixel electrode. A common electrode may be formed on the passivation layer. The common electrode may include a slit exposing a portion of the pixel electrode and an aperture exposing at least a portion of the gate electrode.

BRIEF DESCRIPTION OF THE DRAWINGS

A more complete appreciation of the present invention will become more apparent by describing in detail exemplary embodiments thereof with reference to the accompanying drawings, wherein.

DETAILED DESCRIPTION

Figure 1:
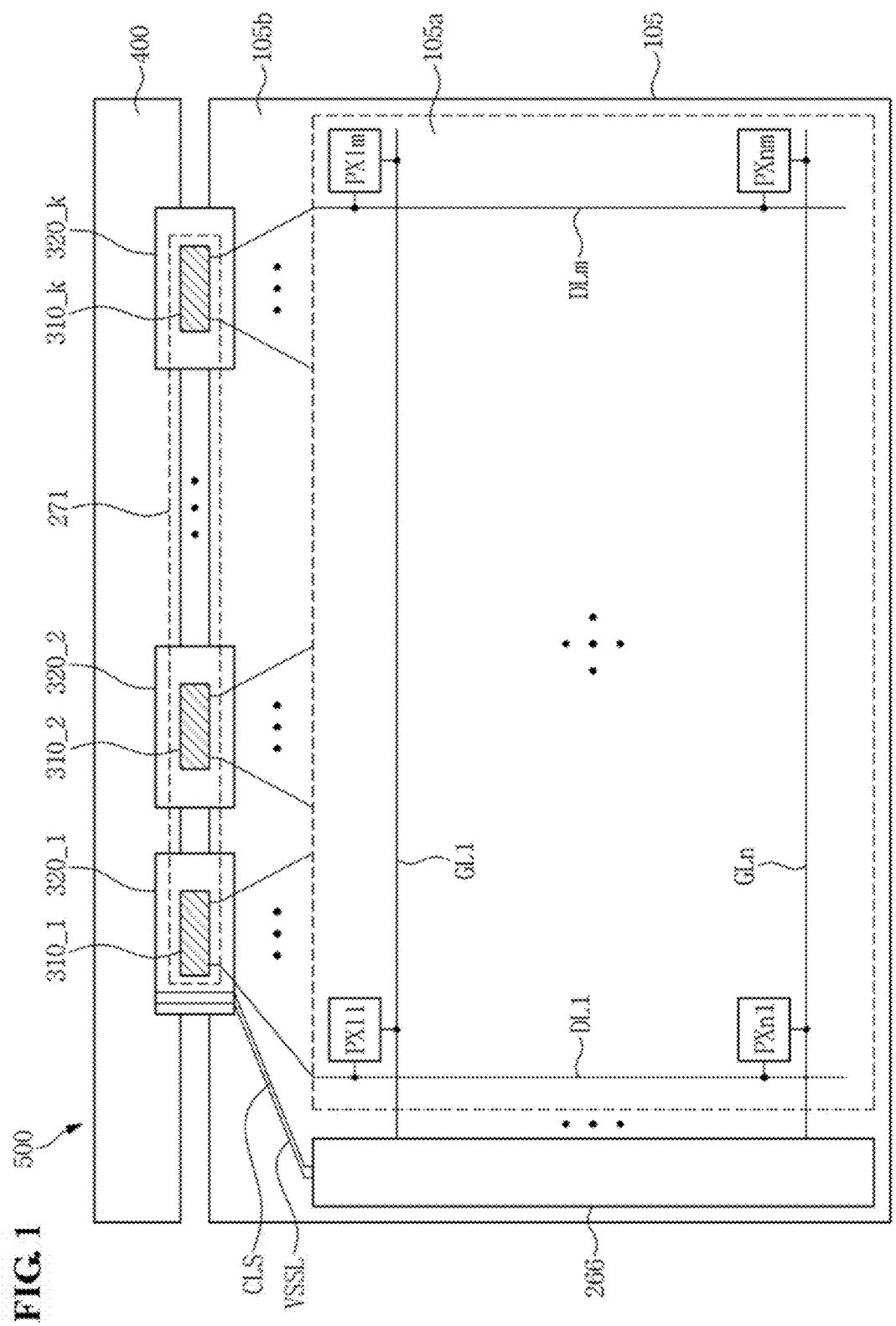
FIG. 1 is a plan view illustrating a liquid crystal display ("LCD") device according to an exemplary embodiment of the present invention.

Exemplary embodiments of the present invention will now be described more fully hereinafter with reference to the accompanying drawings in which exemplary embodiments of the present invention are shown. Exemplary embodiments of the present invention may, however, be embodied in many different forms and should not be construed as being limited to the embodiments set forth herein. Like reference numerals may refer to like elements throughout the specification and drawings.

The spatially relative terms "below", "beneath", "lower", "above", or "upper" may be used to describe the relationship between one element or component and another element or component. It will be understood that the spatially relative terms may encompass different orientations of the device in use or operation, in addition to the orientation depicted in the drawings.

Throughout the specification and drawings, when an element is referred to as being "connected" to another element, the element may be "directly connected" to the other element, or "electrically connected" to the other element or one or more intervening elements may be disposed between the elements.

It will be understood that, although the terms "first," "second," or "third," may be used herein to describe various elements, these elements should not be limited by these terms.

FIG. 1 is a plan view illustrating a liquid crystal display ("LCD") device according to an exemplary embodiment of the present invention.

An LCD device 500 according to an exemplary embodiment of the present invention may include a display panel 105, an upper panel 200 (see, e.g., FIG. 3), a gate driver 266, a data driver 271, and a driving circuit board 400.

The display panel 105 may include a display area 105a in which a plurality of pixels (e.g., pixels PX11, PX1m, PXnm and PXn1) arranged in a matrix form are disposed, a non-display area 105b surrounding the display area 105a, a plurality of gate lines GL1-GLn, a plurality of data lines DL1-DLm intersecting the plurality of gate lines GL1-GLn, a control signal wiring unit CLS, and an off-voltage line VSSL.

The gate lines GL1-GLn may be connected to the gate driver 266. The gate lines GL1-GLn may receive gate signals sequentially generated from the gate driver 266 and sequentially applied to the gate lines GL1-GLn.

The data lines DL1-DLm may be connected to the data driver 271. The data lines DL1-DLm may receive data voltages in an analog form from the data driver 271.

The plurality of pixels (e.g., pixels PX11, PX1m, PXnm and PXn1) may be respectively disposed in areas in which the gate lines GL1-GLn and the data lines intersect one another. The plurality of pixels (e.g., pixels PX11, PX1m, PXnm and PXn1) may be arranged in "m" number of columns and "n" number of rows, and the columns and rows may intersect one another. "m" and "n" may each be an integer greater than zero.

The plurality of pixels (e.g., pixels PX11, PX1m, PXnm and PXn1) may be connected to the gate lines GL1-GLn and the data lines DL1-DLm, respectively, in a corresponding manner. The plurality of pixels (e.g., pixels PX11, PXnm and PXn1) may each receive the data voltage from corresponding data lines, in response to the gate signals applied from corresponding gate lines. The plurality of pixels (e.g., pixels PX11, PX1m, PXnm and PXn1) may each display a gray scale corresponding to the data voltage.

The control signal wiring unit CLS may be connected to the gate driver 266 through a leftmost flexible printed circuit board ("FPCB") 320_1. The control signal wiring unit CLS may receive control signals from a timing controller which is disposed on the driving circuit board 400. The control signals may be supplied to the gate driver 266 through the control signal wiring unit CLS. The off-voltage line VSSL may be connected to the gate driver 266 through the leftmost FPCB 320_1. The off-voltage line VSSL may receive an off-voltage from a power generator which is disposed on the driving circuit board 400. The off-voltage may be supplied to the gate driver 266 through the off-voltage line VSSL.

The gate driver 266 may be disposed in a portion of the non-display area 105b adjacent to a side of the display area 105a. The gate driver 266 may be disposed on a portion of the non-display area 105b adjacent to a left side of the display area 105a. The gate driver 266 may sequentially generate the gate signals, using the control signals supplied through the control signal wiring unit CLS, and may supply the generated gate signals to the gate lines GL1-GLn. The gate lines GL1-GLn may be sequentially driven from an uppermost gate line to a lowermost gate line.

The data driver 271 may receive data signals from the timing controller, and may generate analog data voltages corresponding to the data signals. The data driver 271 may supply data voltages to the plurality of pixels (e.g., pixels PX11, PX1m, PXnm and PXn1) through the data lines DL1-DLm. The data driver 271 may include a plurality of source driving chips 310_1-310_k. "k" may be an integer greater than zero and less than "m". The source driving chips 310_1-310_k may each be disposed on corresponding FPCBs 320_1-320_k. The source driving chips 310_1-310_k may each by connected between the driving circuit board 400 and a portion of the non-display area 105b adjacent to an upper portion of the display area 105a.

Figure 2:
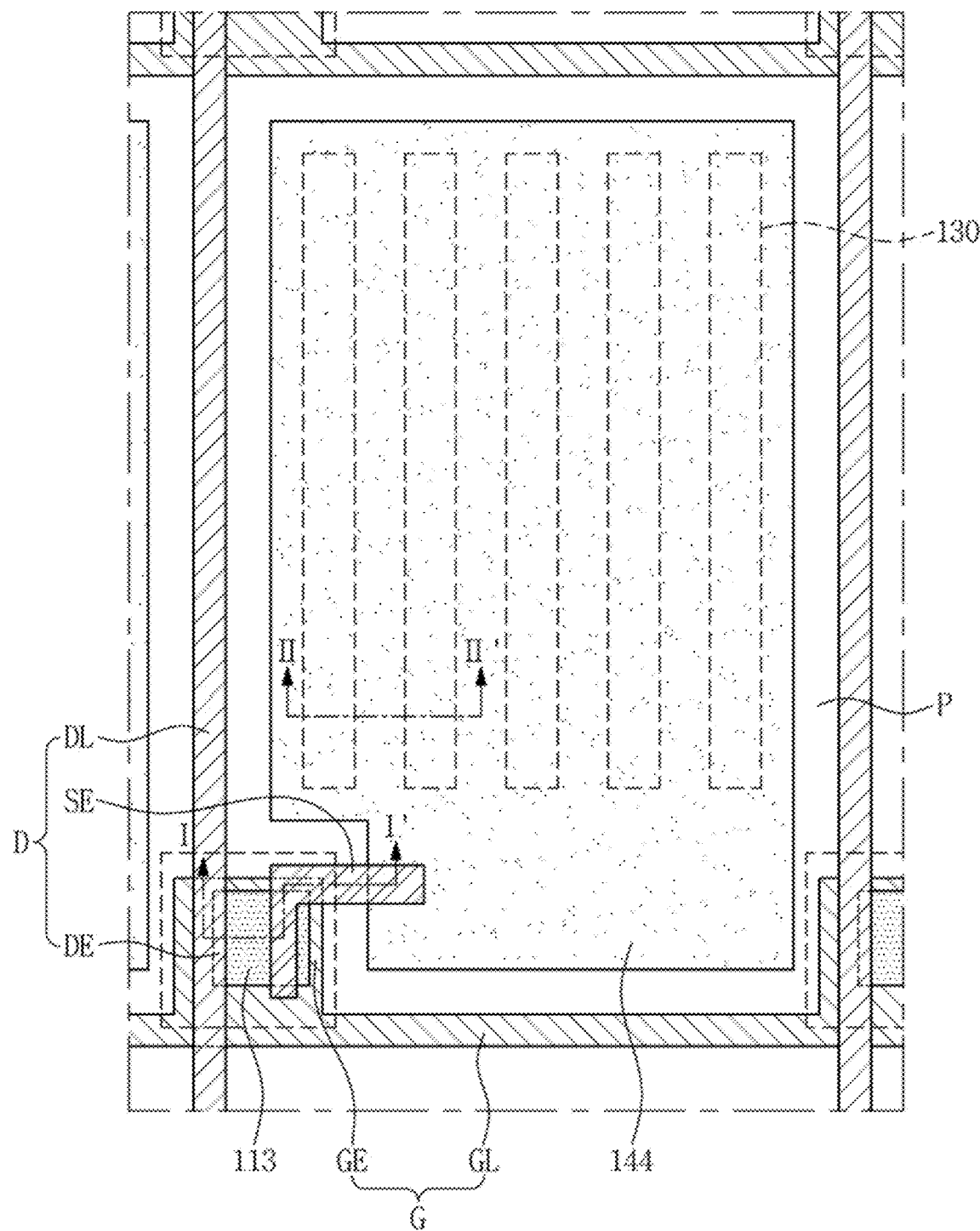
FIG. 2 is a detailed configuration view illustrating a pixel of FIG. 1.
Figure 3:
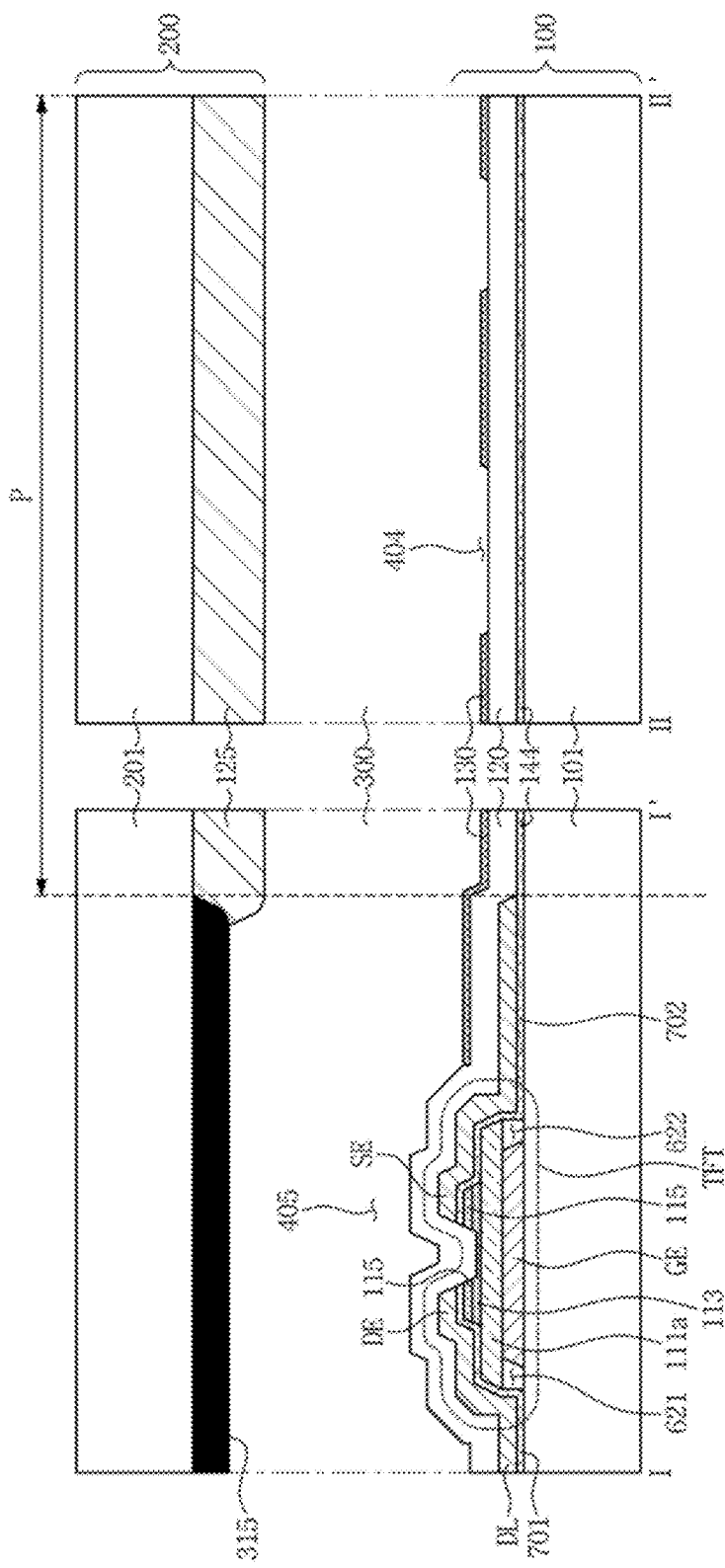
FIG. 3 is a cross-sectional view taken along line I-I' and II' of FIG. 2.

The source driving chips 310_1-310_k may each be disposed on the portion of the non-display area 105b adjacent to the upper portion of the display area 105a, in a chip-on-glass (COG) manner, FIG. 2 is a detailed configuration view illustrating a pixel of FIG. 1. FIG. 3 is a cross-sectional view taken along line I-I' and II-II' of FIG. 2.

In reference to FIGS. 2 and 3, the display panel 105 may include a lower panel 100 and the upper panel 200. The lower panel 100 and the upper panel 200 may be disposed on opposite sides of a liquid crystal layer 300 disposed between the lower panel 100 and the upper panel 200.

The lower panel 100 may include a lower substrate 101, a gate transmitting member G, a first gate insulating layer 111a, a semiconductor layer 113, an ohmic contact layer 115, a data transmission member D, a passivation layer 120, a common electrode 130, and a pixel electrode 144.

The lower substrate 101 may be an insulating substrate including a transparent material, such as glass or plastic.

The gate transmitting member G may be disposed on the lower substrate 101. The gate transmitting member G may include a gate line GL and a gate electrode GE. The gate line GL may have a width different from a width of the gate electrode GE. For example, the width of the gate electrode GE may be larger than the width of the gate line GL. The width of the gate electrode GE may be greater than the width of the gate line GL. The gate line GL and the gate electrode GE may be integrally formed.

The gate line GL may include a connecting portion (e.g., an end portion). The connecting portion may be greater in size than other portions of the gate line GL. The connecting portion of the gate line GL may be connected to another layer or the gate driver 266.

The gate electrode GE may be a part of the gate line GL. The gate electrode may have a shape protruding from the gate line GL.

The gate transmitting member G may include at least one metal of aluminum (Al) or alloys thereof, silver (Ag) or alloys thereof copper (Cu) or alloys thereof, and/or molybdenum (Mo) or alloys thereof. The gate transmitting member G may include one of chromium (Cr), tantalum Ta), and titanium (Ti). In some exemplary embodiments of the present invention, the gate transmitting member C may have a multi-layer structure including at least two conductive layers that have different physical properties from each other.

The first gate insulating layer 111a may be disposed on the gate transmitting member G.

The first gate insulating layer 111a may include silicon nitride ($SiN_x$), or silicon oxide ($SiO_x$). The first gate insulating layer 111a may have a multi-layer structure including at least two insulating layers that have physical properties different from each other. The two insulating layers may be stacked vertically.

Figure 4:
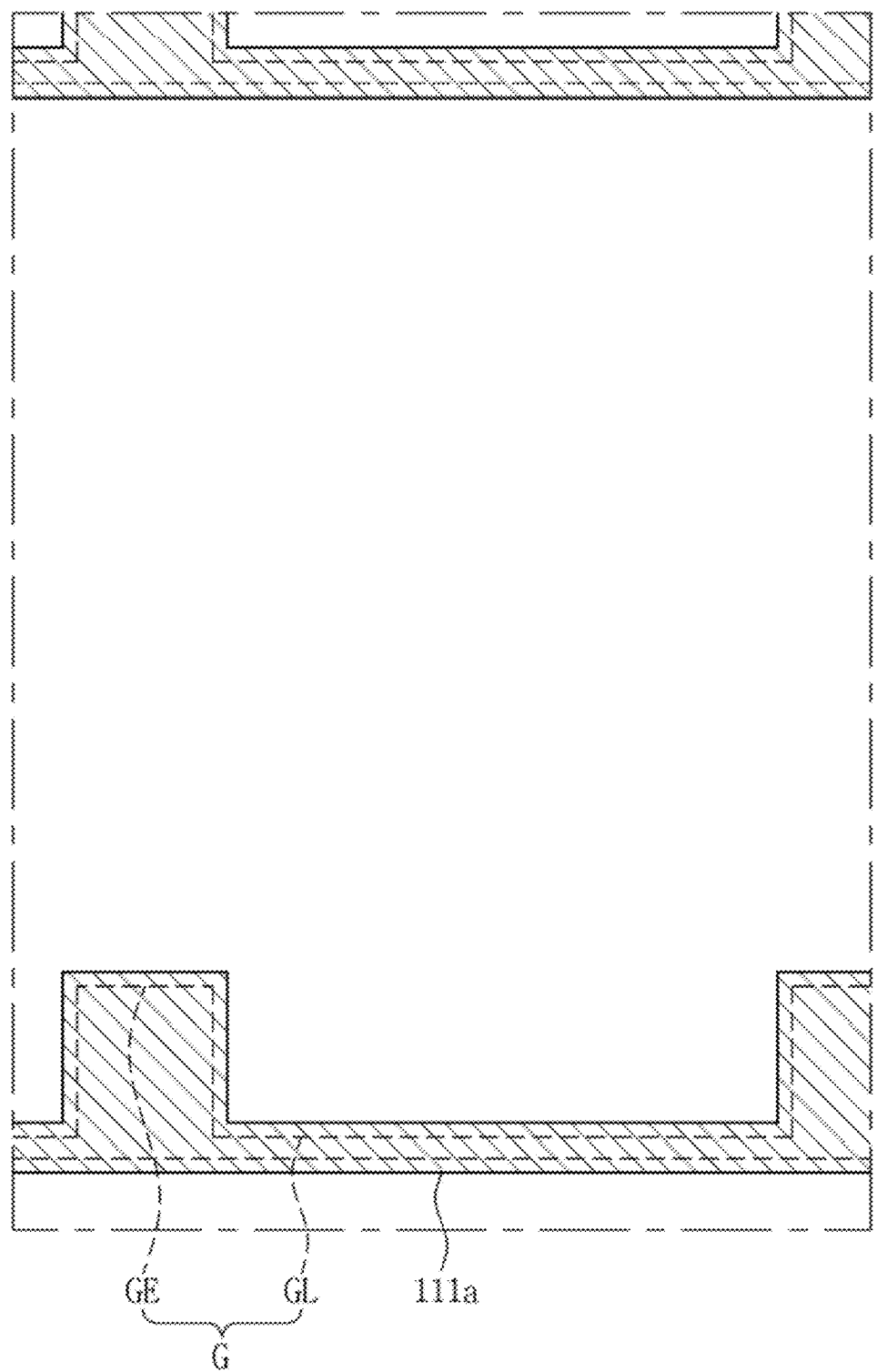
FIG. 4 is a view illustrating a shape of a gate transmitting member and a first gate insulating layer.

FIG. 4 is a view illustrating a shape of a gate transmitting member and a first gate insulating layer. The gate transmitting member G of FIG. 4 may be substantially the same as the gate transmitting member G illustrated in FIG. 2. The first gate insulating layer 111a illustrated in FIG. 4 may be substantially the same as the first gate insulating 111a illustrated in FIG. 3. The gate insulating layer 111a illustrated in FIG. 4 may be illustrated from the same perspective as the perspective the first gate insulating layer 111a of FIG. 2.

Referring to FIGS. 3 and 4, the first gate insulating layer 111a may have substantially the same shape as that of the gate transmitting member G. However, the first gate insulating layer 111a may have a greater size than that of the gate transmitting member G. While the shape of the first gate insulating layer 111a and the shape of the gate transmitting member G may be substantially the same as each other, the size of the first gate insulating layer 111a may be greater than the size of the gate transmitting member G. In other words, the first gate insulating layer 111a and the gate transmitting member G have like figures.

The semiconductor layer 113 may be disposed on the first gate insulating layer 111a. The semiconductor layer 113 may overlap the gate transmitting member G. For example, the semiconductor layer 113 may overlap the gate electrode GE of the gate transmitting member G. The semiconductor layer 113 may include amorphous silicon, polycrystalline silicon, or indium gallium zinc oxide (IGZO).

The ohmic contact layer 115 may be disposed on the semiconductor layer 113. The ohmic contact layer 115 may include silicide hydrogenated amorphous silicon doped with n-type impurities, such as phosphorus, at a relatively high concentration. Pairs of ohmic contact layers 115 may be disposed on the semiconductor layer 113. The ohmic contact layers 115 forming a pair may be separated from each other.

A dummy pattern 701 may be disposed on one of the ohmic contact layers 115, the first gate insulating layer 111a, and the lower substrate 101. The dummy pattern 701 may overlap the semiconductor layer 113 and the gate transmitting member G.

A gap 621 may be formed between the dummy pattern 701 and the gate transmitting member G. The gap 621 may be a space surrounded by the lower substrate 101, the gate transmitting member G, the first gate insulating layer 111a, and the dummy pattern 701. The gap 621 may be formed by a difference between the size of the gate transmitting member G and the size of the first gate insulating layer 111a. The dummy pattern 701 and the gate transmitting member G may be electrically separated from each other by the gap 621.

The dummy pattern 701 may include a transparent conductive material such as indium tin oxide ("ITO") or indium zinc oxide ("IZO"). ITO may be a polycrystalline or monocrystalline material, and IZO may be a polycrystalline or monocrystalline material.

A connecting portion 702 may be a portion of the pixel electrode 144, and may be disposed on one of the ohmic contact layers 115, the first gate insulating layer 111a, and the lower substrate 101. The connecting portion 702 may overlap the semiconductor layer 113 and the gate transmitting member G.

A gap 622 may be formed between the connecting portion 702 and the gate transmitting member G. The gap 622 may be a space surrounded by the lower substrate 101, the gate transmitting member G, the first gate insulating layer 111a, and the connecting portion 702. The gap 622 may be formed by a difference between the size of the gate transmitting member G and the size of the first gate insulating layer 111a. The connecting portion 702 and the gate transmitting member G may be electrically separated from each other by the gap 622.

The connecting portion 702 may include the same material and may have the same structure (e.g., a multi-layer structure) as those of the dummy pattern 701. The connecting portion 702 and the dummy pattern 701 may be substantially simultaneously formed by the same process.

The pixel electrode 144 may generate a horizontal electric field, along with the common electrode 130. The pixel electrode 144 may be disposed on the lower substrate 101. The pixel electrode 144 may be disposed in a pixel region P of the lower substrate 101, and the pixel electrode 144 may overlap the common electrode 130.

The pixel electrode 144 may include the same material and may have the same structure (e.g., a multi-layer structure) as those of the dummy pattern 701. The pixel electrode 144 and the dummy pattern 701 may be substantially simultaneously formed by the same process.

The data transmitting member D may include the data line DL, a drain electrode DE, and a source electrode SE.

The data transmitting member D may include a refractory metal, such as Mo, Cr, Ta, and Ti, or a metal alloy thereof, and may have a multi-layer structure including a refractory metal layer and a low-resistance conductive layer. Examples of the multi-layer structure may include: a double-layer structure including a Cr or Mo (alloy) lower film and an Al (alloy) upper film; and a triple-layer structure including a Mo (alloy) lower film, an Al (alloy) intermediate film, and a Mo (alloy) upper film. In some exemplary embodiments of the present invention, the data transmitting member D may include various metals or conductive materials other than the aforementioned materials.

The data line DL and the drain electrode DE may be disposed on the dummy pattern 701. A structure including the data line DL and the drain electrode DE may have substantially the same shape as that of the dummy pattern 701. The structure including the data line DL and the drain electrode DE may be substantially the same size as the dummy pattern 701.

The drain electrode DE may overlap the semiconductor layer 113 and the gate transmitting member G. For example, the drain electrode DE may overlap a portion of the semiconductor layer 113 and the gate electrode GE of the gate transmitting member G.

The drain electrode DE may be a portion of the data line DL. The drain electrode DE may branch off from the data line DL and may have a protruding shape. When the drain electrode DE has the protruding shape, the drain electrode DE may form a C-shape surrounding a part of the source electrode SE. At least a portion of the drain electrode DE may overlap the semiconductor layer 113 and the gate electrode GE. The drain electrode DE may have an inverted C-shape, a U-shape, or an inverted U-shape.

The source electrode SE may be disposed on the connecting portion 702. The source electrode SE may have substantially the same shape as that of the connecting portion 702. The source electrode SE may be substantially the same size as the connecting portion 702. The source electrode SE may be in contact with the connecting portion 702.

The source electrode SE may overlap the semiconductor layer 113 and the gate transmitting member G. For example, the source electrode SE may overlap a portion of the semiconductor layer 113 and the gate electrode GE of the gate transmitting member G.

The source electrode SE may also include the same material and have the same structure (e.g., a multi-layer structure) as those of the drain electrode DE. The source electrode SE and the drain electrode DE may be substantially simultaneously formed by the same process.

The gate electrode GE, the drain electrode DE, and the source electrode SE may form a pixel thin film transistor ("TFT"), along with the semiconductor layer 113. A channel of the pixel TFT may be formed on a portion of the semiconductor layer 113 between the source electrode SE and the drain electrode DE. The portion of the semiconductor layer 113 corresponding to the channel may have a thickness smaller than that of other portions of the semiconductor layer 113.

The passivation layer 120 may be disposed on the data transmitting member D. The passivation layer 120 may be disposed over substantially an entire surface of the lower substrate 101 including the data transmitting member D.

The passivation layer 120 may include an inorganic insulating material such as silicon nitride ($SiN_x$) or silicon oxide ($SiO_x$). When the passivation layer 120 includes the inorganic insulating material, the inorganic insulating material may be a photosensitive inorganic insulating material and may have a dielectric constant of about 4.0.

The passivation layer 120 may have a multi-layer structure including organic layers and inorganic layers. When the passivation layer 120 has the multi-layer structure, the insulating properties of the passivation layer 120 may be relatively high and damage to exposed portions of the semiconductor layer 113 may be reduced or prevented.

As examples, the passivation layer 120 may have a thickness of greater than or equal to about 5000 angstroms (Δ), for example, in a range of about 6000 Å to about 8000 Å. The passivation layer 120 may have a contact hole, which will be described in more detail below.

The common electrode 130 may receive a common voltage. The common electrode 130 may be disposed on the passivation layer 120. The common electrode 130 may be formed over substantially an entire surface of the display area 105a of the lower substrate 101. The common electrode 130 may overlap the source electrode SE, the connecting portion 702, and the pixel electrode 144.

The common electrode 130 may include the same material and may have the same structure (e.g., a multi-layer structure) as those of the pixel electrode 144. The common electrode 130 and the pixel electrode 144 may be substantially simultaneously formed by the same process.

Figure 5:
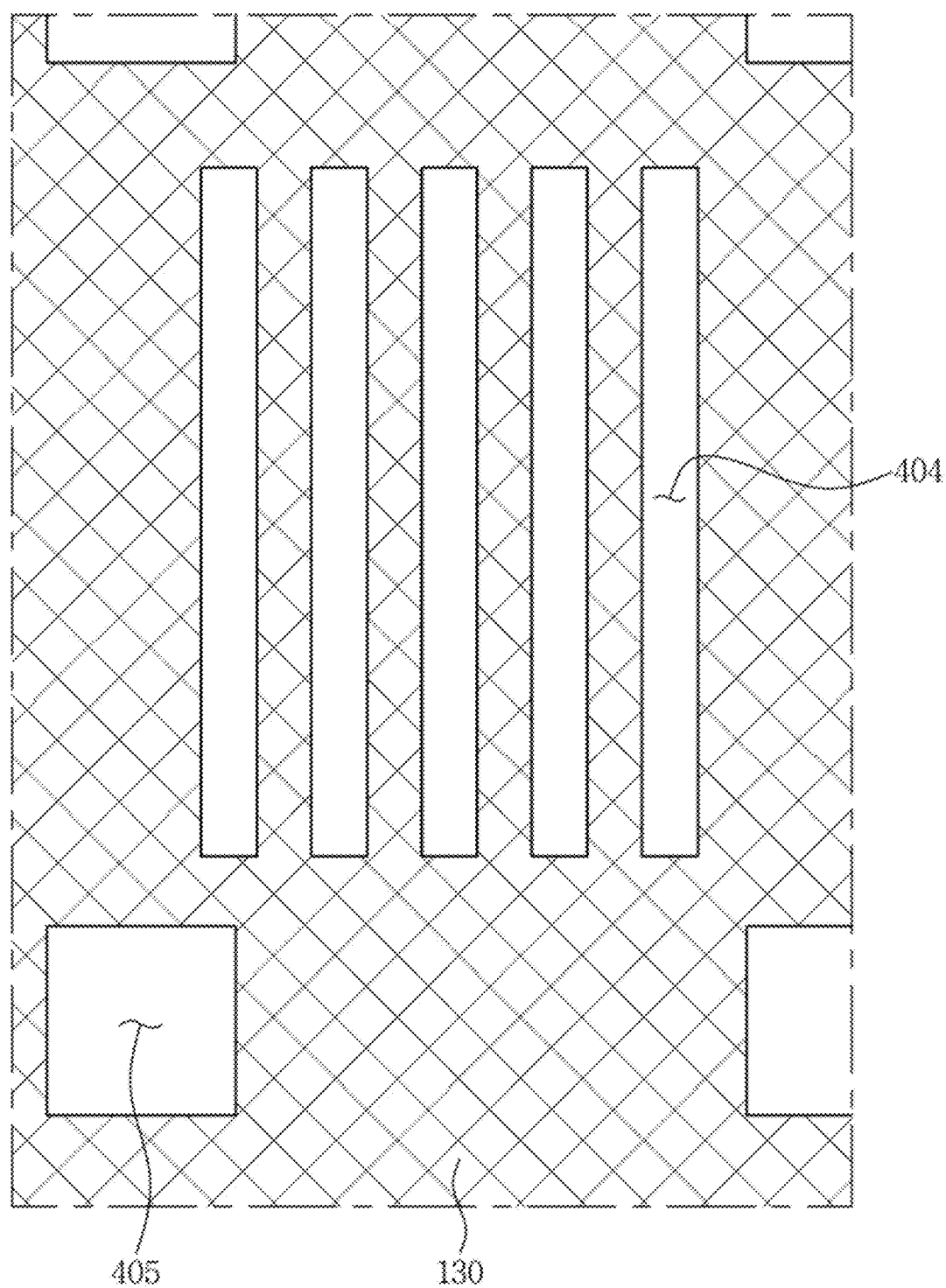
FIG. 5 is a view illustrating a portion of the common electrode of FIG. 2.

FIG. 5 is a view illustrating a portion of the common electrode of FIG. 2.

The common electrode 130 may have at least one slit 404 and an aperture 405. The at least one slit 404 may be disposed in an area of the common electrode 130 corresponding to the pixel electrode 144, and the aperture 405 may be disposed in an area of the common electrode 130 corresponding to the gate electrode GE. A horizontal electric field may be generated between the pixel electrode 144 and the common electrode 130 by the at least one slit 404. Formation of a back channel in the pixel TFT may be reduced or prevented by the aperture 405.

A lower alignment layer may be disposed on the passivation layer 120 and the common electrode 130. The lower alignment layer may be a homeotropic alignment layer, and may include at least one photoreactive material.

The lower alignment layer may include at least one of polyamic acid, polysiloxane, and polyimide.

The upper panel 200 may include an upper substrate 201, a light shielding layer 315, and a color filter 125.

The upper substrate 201 may include an insulating substrate including a transparent material such as glass or plastic.

The light shielding layer 315 may be disposed on the upper substrate 201. The light shielding layer 315 may be configured to prevent light emission through an area other than the pixel region P. The light shielding layer 315 may prevent light leakage in a non-pixel region. The light shielding layer 315 may have an aperture in the pixel region P, and may cover an entire area outside of the pixel region P. The display area 105a of the upper substrate 201 and the non-display area 105b of the upper substrate 201 may be substantially covered by the light shielding layer 315.

The color filter 125 may be disposed on the upper substrate 201. The color filter 125 may be disposed in an area of the upper substrate 201 corresponding to the pixel region P of the upper substrate 201. The color filter 125 may include a red color filter, a green color filter, and a blue color filter.

The color filter 125 may be disposed on the lower substrate 101. The color filter 125 may be disposed in a pixel region of the lower substrate 101.

The upper panel 200 may include an upper alignment layer. The upper alignment layer may be disposed on the light shielding layer 315 and the color filter 125.

The upper alignment layer may include a same material as that of the lower alignment layer.

A surface of the lower substrate 101 facing the upper substrate 102 may be referred to as an upper surface of the lower substrate 101, and a surface of the lower substrate 101 facing away from the upper substrate 102 may be referred to as a lower surface of the lower substrate 101. A surface of the upper substrate 102 facing the lower substrate 101 may be referred to as a lower surface of the upper substrate 102, and a surface of the upper substrate 102 facing away from the lower substrate 101 may be referred to as an upper surface of the upper substrate 102. An upper polarizer may be disposed on the lower surface of the lower substrate 101, and a lower polarizer may be disposed on the lower surface of the upper substrate 201.

A transmission axis of the upper polarizer may be perpendicular to a transmission axis of the lower polarizer, and thus one of the transmission axes thereof and the line portion 411 of the gate line GL may be disposed in parallel to each other. The display device according to an exemplary embodiment of the present invention may include one of the upper polarizer and the lower polarizer.

The liquid crystal layer 300 may include a nematic liquid crystal material having positive dielectric anisotropy. The nematic liquid crystal molecules of the liquid crystal layer 300 may have a structure in which a major axis thereof is parallel to one of the lower panel 100 and the upper panel 200 and the direction of the nematic liquid crystal molecules may be spirally twisted at an angle of 90 degrees from a rubbing direction of the alignment layer of the lower panel 100 to the upper panel 200. Alternatively, the liquid crystal layer 300 may include homeotropic liquid crystal materials.

Figure 6:
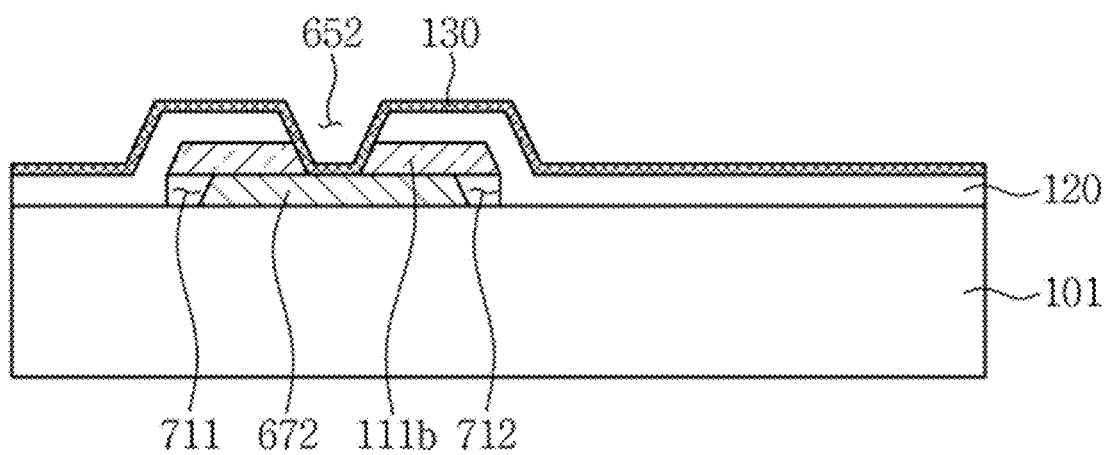
FIG. 6 is a view illustrating a connection between a common electrode and a pad electrode.

FIG. 6 is a view illustrating connection between a common electrode and a pad electrode.

A pad electrode 672 may be disposed in the non-display area 105b of the display panel 105. A common voltage (e.g., an externally generated common voltage) may be applied to the common electrode 130 through the pad electrode 672.

The pad electrode 672 may include the same material and may have the same structure (e.g., a multi-layer structure) as those of the gate transmitting member G. The pad electrode 672 and the gate transmitting member G may be substantially simultaneously formed by the same process.

A second gate insulating layer 111b may be disposed on the pad electrode 672.

The second gate insulating layer 111b may include the same material and may have the same structure (e.g., a multi-layer structure) as those of the first gate insulating layer 111a, The second gate insulating layer 111b and the first gate insulating layer 111a may be substantially simultaneously formed by the same process.

The second gate insulating layer 111b may have substantially the same shape as that of the pad electrode 672. The second gate insulating layer 111b may have a size greater than that of the pad electrode 672. That is, while the shape of the second gate insulating layer 111b and the shape of the pad electrode 672 may be substantially the same as each other, the size of the second gate insulating layer 111b may be greater than the size of the pad electrode 672. In other words, the second gate insulating layer 111b and the pad electrode 672 have like figures.

The passivation layer 120 and the second gate insulating layer 111b may have a pad contact hole 652 extending therethrough, and the pad electrode 672 and the common electrode 130 may be connected to each other through the pad contact hole 652.

Gaps 711 and 712 may be formed between the passivation layer 120 and the pad electrode 672. The gaps 711 and 712 may be surrounded by the lower substrate 101, the pad electrode 672, the second gate insulating layer 111b, and the passivation layer 120. The gaps 711 and 712 may be formed by a difference between the size of the pad electrode 672 and the size of the second gate insulating layer 111b.

Figure 7:
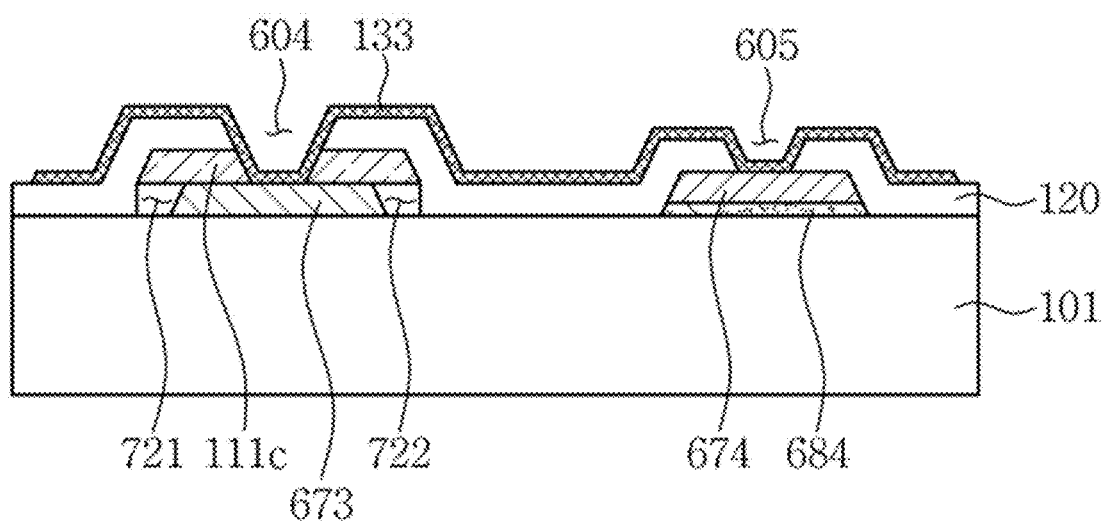
FIG. 7 is a view illustrating a connection between a gate electrode and a drain electrode of a driving transistor.

FIG. 7 is a view illustrating connection between a gate electrode and a drain electrode of a driving transistor.

A driving transistor may be disposed in the gate driver 266. The gate driver 266 may include a shift resister sequentially outputting gate signals, and the driving transistor may be one of a number of switching elements included in the shift resister. For example, the driving transistor may be a diode-type driving transistor of which a gate electrode 673 and a drain electrode 674 are connected to each other, and FIG. 7 illustrates a cross-sectional structure of the diode-type driving transistor. Meanwhile, the diode-type driving transistor may include a semiconductor layer, and the semiconductor layer is not illustrated in FIG. 7.

The gate electrode 673 of the driving transistor may be disposed on the lower substrate 101.

The gate electrode 673 of the driving transistor may include the same material and may have the same structure (e.g., a multi-layer structure) as those of the gate transmitting member G. The gate electrode 673 of the driving transistor and the gate transmitting member G may be substantially simultaneously formed by the same process.

A third gate insulating layer 111c may be disposed on the gate electrode 673 of the driving transistor.

The third gate insulating layer 111c may include the same material and may have the same structure (e.g., a multi-layer structure) as those of the first gate insulating layer 111a. The third gate insulating layer 111c and the first gate insulating layer 111a may be substantially simultaneously formed by the same process.

The third gate insulating layer 111c may have substantially the same shape as that of the gate electrode 673 of the driving transistor. The third gate insulating layer 111c may have a size greater than that of the gate electrode 673. That is, while the shape of the third gate insulating layer 111c and the shape of the gate electrode 673 may be substantially identical to each other, the size of the third gate insulating layer 111c may be greater than the size of the gate electrode 673. In other words, the third gate insulating layer 111c and the gate electrode 673 of the driving transistor have like figures.

A dummy drain electrode 684 may be disposed on the lower substrate 101.

The dummy drain electrode 684 may include the same material and may have the same structure (e.g., a multi-layer structure) as those of the pixel electrode 144. The dummy drain electrode 684 and the pixel electrode 144 may be substantially simultaneously formed by the same process.

The drain electrode 674 of the driving transistor may be disposed on the dummy drain electrode 684. The drain electrode 674 of the driving transistor may have substantially the same size as that of the dummy drain electrode 684.

The passivation layer 120 and the third gate insulating layer 111c may have a gate contact hole 604 and a drain contact hole 605 extending therethrough, and the gate electrode 673 of the driving transistor and the drain electrode 674 of the driving transistor may be connected to each other through the gate contact hole 604 and the drain contact hole 605.

Gaps 721 and 722 may be formed between the passivation layer 120 and the gate electrode 673 of the driving transistor. The gaps 721 and 722 may be surrounded by the lower substrate 101 the gate electrode 673 of the driving transistor, the third gate insulating layer 111c, and the passivation layer 120. The gaps 721 and 722 may be formed by a difference between the size of the gate electrode 673 of the driving transistor and the size of the third gate insulating layer 111c.

FIGS. 8 to 39 are views illustrating a method of fabricating an LCD device according to an exemplary embodiment of the present invention.

Figure 8:
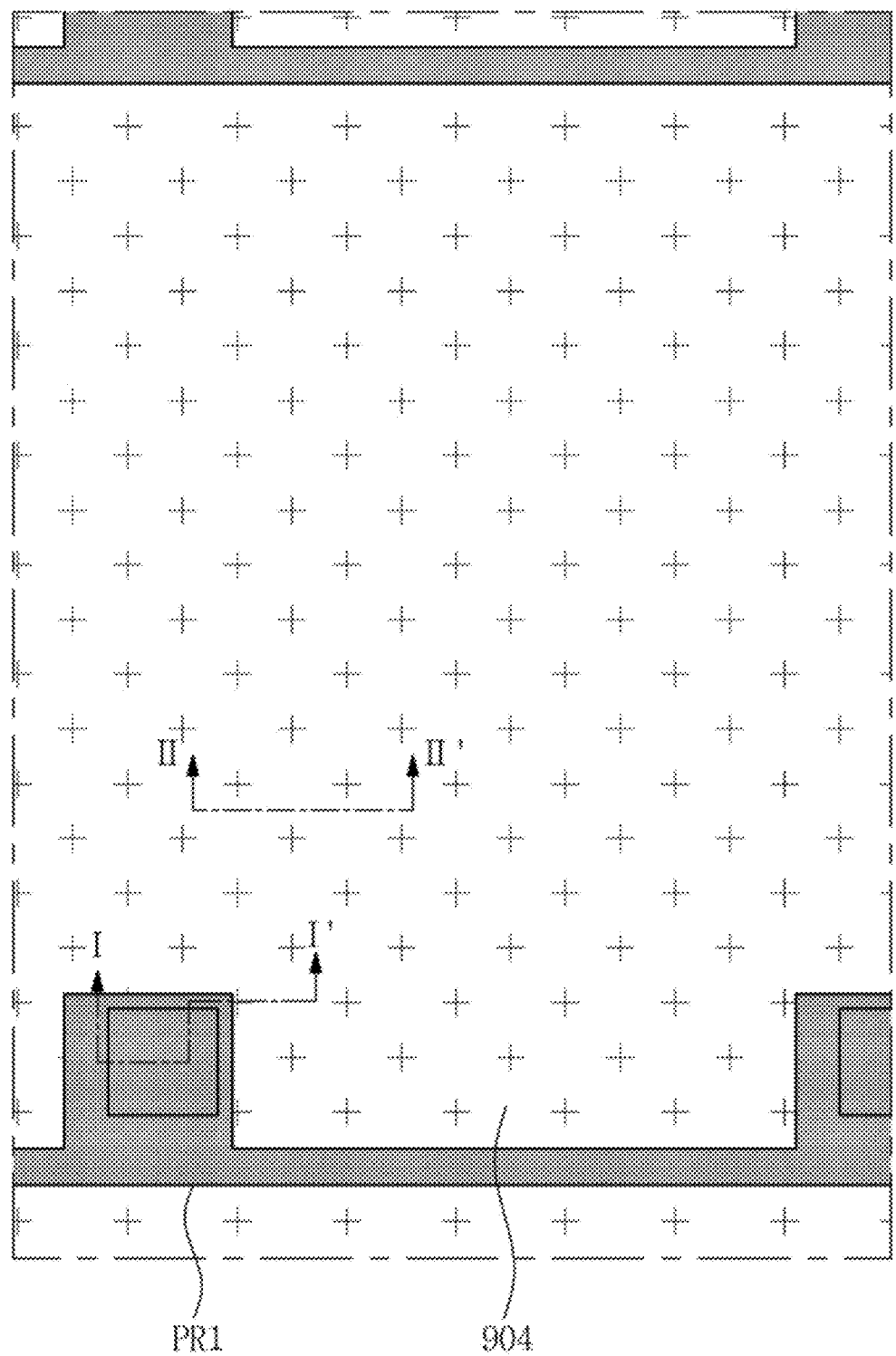
FIGS. 8 to 39 are views illustrating a method of fabricating an LCD device according to an exemplary embodiment of the present invention.
Figure 9:
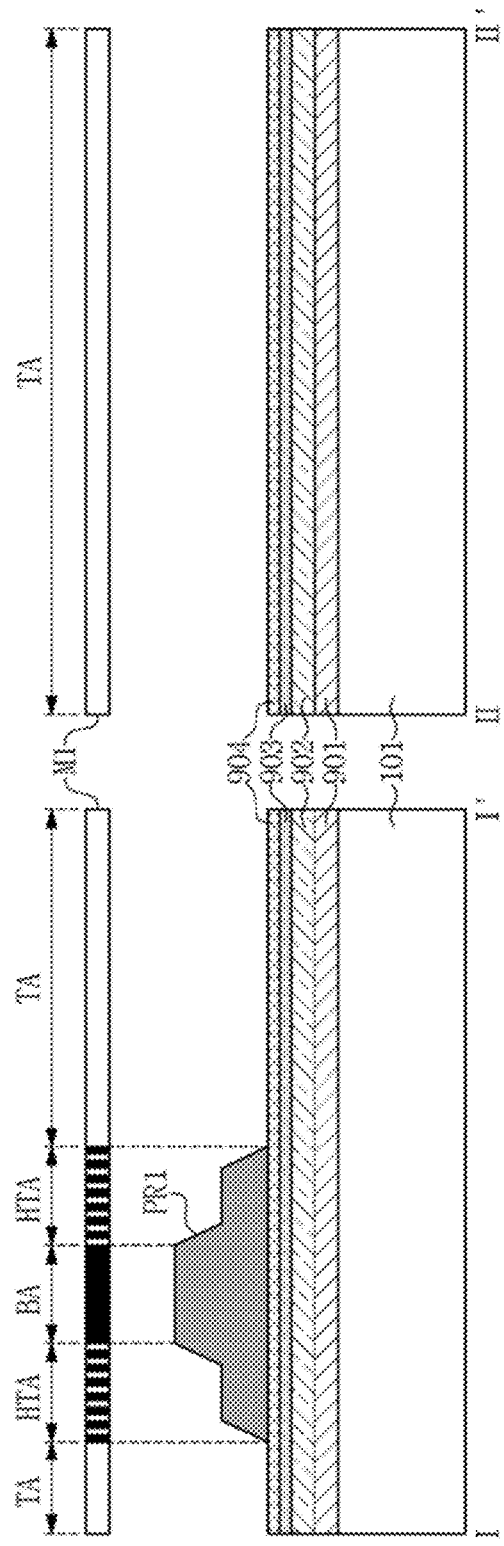
Figure 10:
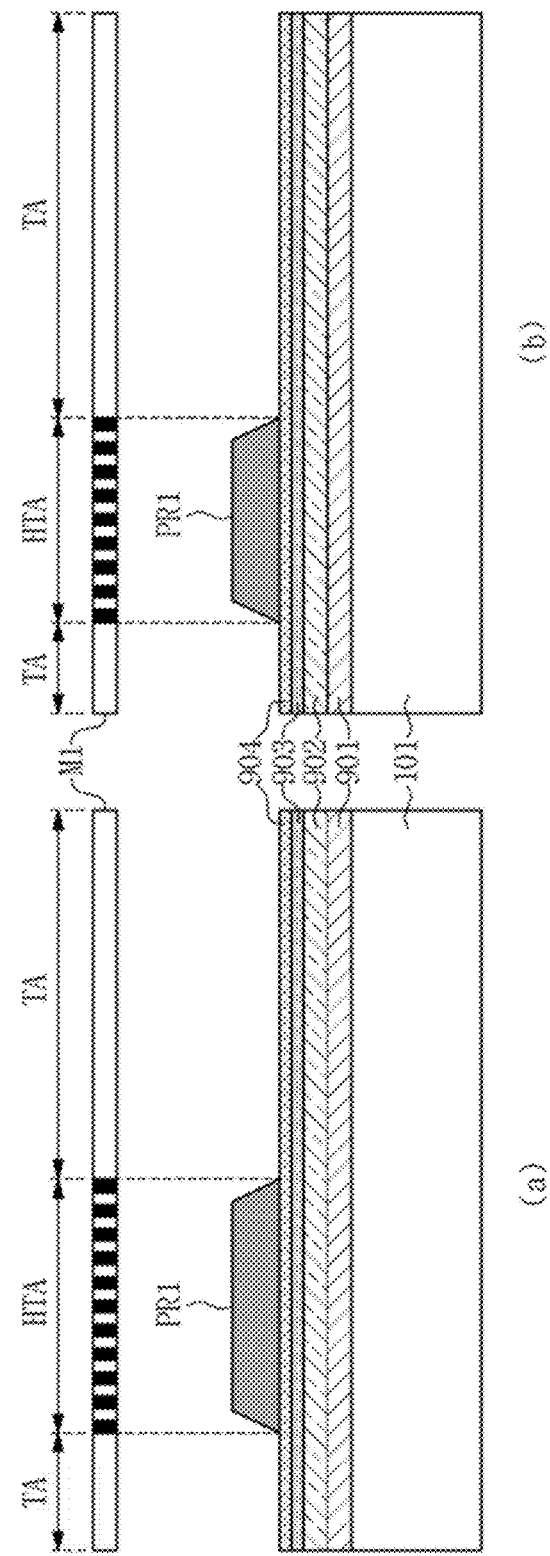
Figure 11:
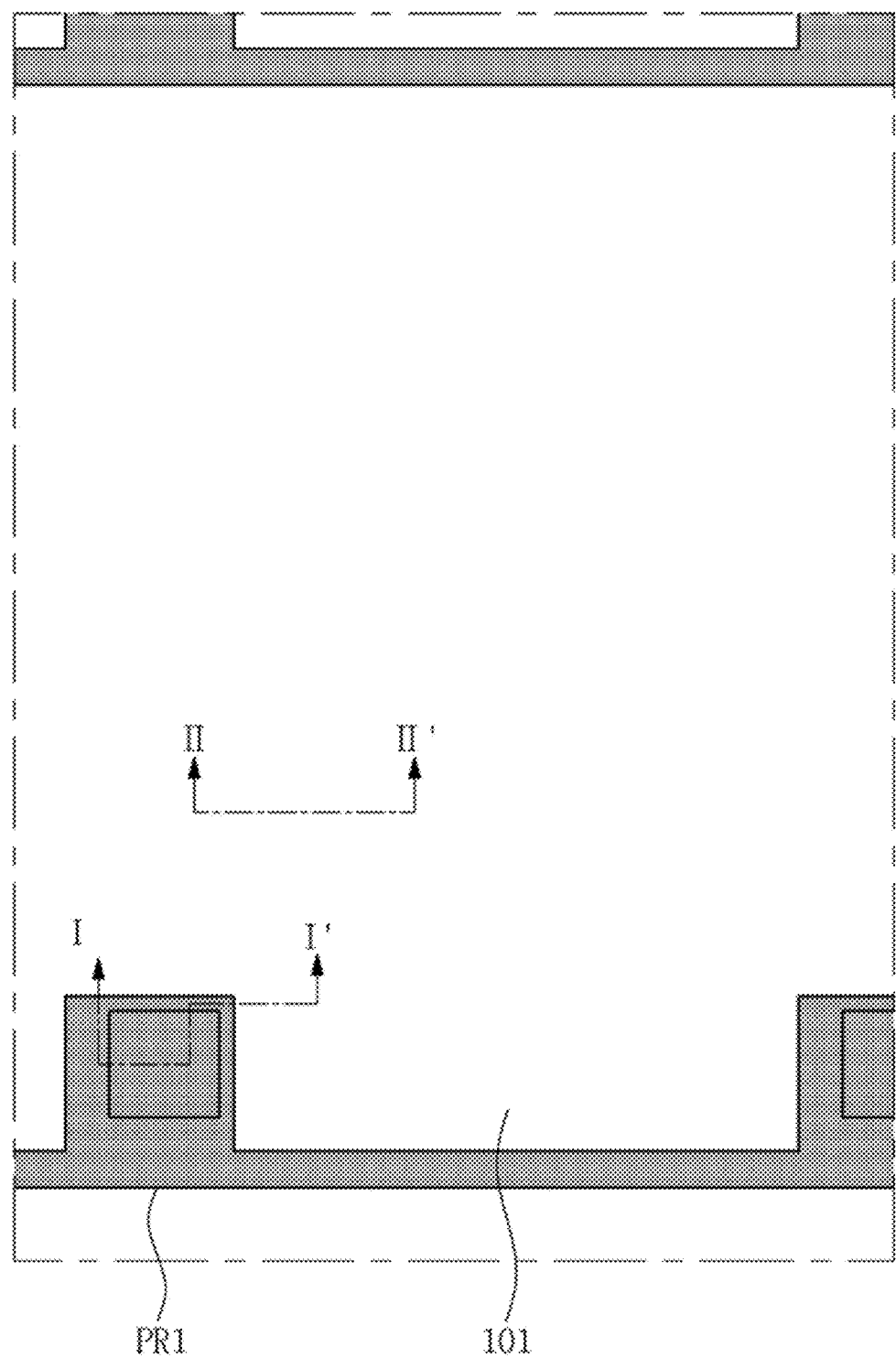

Referring to FIGS. 8, 9, and 10, a gate material 901, an insulating material 902, a semiconductor material 903, and an ohmic contact material 904 may be formed on the lower substrate 101, sequentially. That is, after the gate material 901 is formed over substantially an entire surface of the lower substrate 101, an insulating material 902 may be formed over substantially the entire surface of the lower substrate 101 including the gate material 901, a semiconductor material 903 may then formed over substantially the entire surface of the lower substrate 101 including the insulating material 902, and subsequently, an ohmic contact material 904 may be formed over substantially the entire surface of the lower substrate 101 including the semiconductor material 903.

The gate material 901 may be deposited on the lower substrate 101 in a physical vapor deposition (PVD) method such as sputtering. Then, the insulating material 902, the semiconductor material 903, and the ohmic contact material 904 may be deposited on the lower substrate 101 in a chemical vapor deposition (CVD) method.

A first photoresist may be formed over substantially the entire surface of the lower substrate 101 including the ohmic contact material 904.

Referring to FIGS. 9 and 10, a first mask M1 may be disposed on the first photoresist. The first mask M1 may include a transmission area TA through which light is transmitted, a blocking area BA through which light is not transmitted, and a half-transmission area HTA through which light is partially transmitted. The half-transmission area HTA may include a plurality of slits or a half-transparent layer.

Light such as ultraviolet (UV) light may be selectively radiated onto the first photoresist through the first mask M1, and thus the first photoresist may be exposed to light. When the first photoresist, which may be exposed to light, is developed as illustrated in FIGS. 8, 9, and 10, a first photoresist pattern PR1 may be formed on the ohmic contact material 904, including patterns having different thicknesses from one another. A portion (or a second pattern) of the first photoresist pattern PR1 corresponding to the blocking area BA of the first mask M1 may have a thickness larger than the thickness of a portion (or a first pattern) of the first photoresist pattern PR1 corresponding to the half-transmission area HTA of the first mask M1. A portion of the first photoresist pattern PR1 corresponding to the transmission area TA of the first mask M1 may be removed.

The first photoresist pattern PR1 may be formed on a portion of the ohmic contact material 904 where the gate transmitting member G may be formed. A portion of the first photoresist pattern PR1 having a relatively large thickness may be formed on a portion of the ohmic contact material 904 where the channel region of the pixel TFT and the channel region of the driving transistor may be formed.

Figure 12:
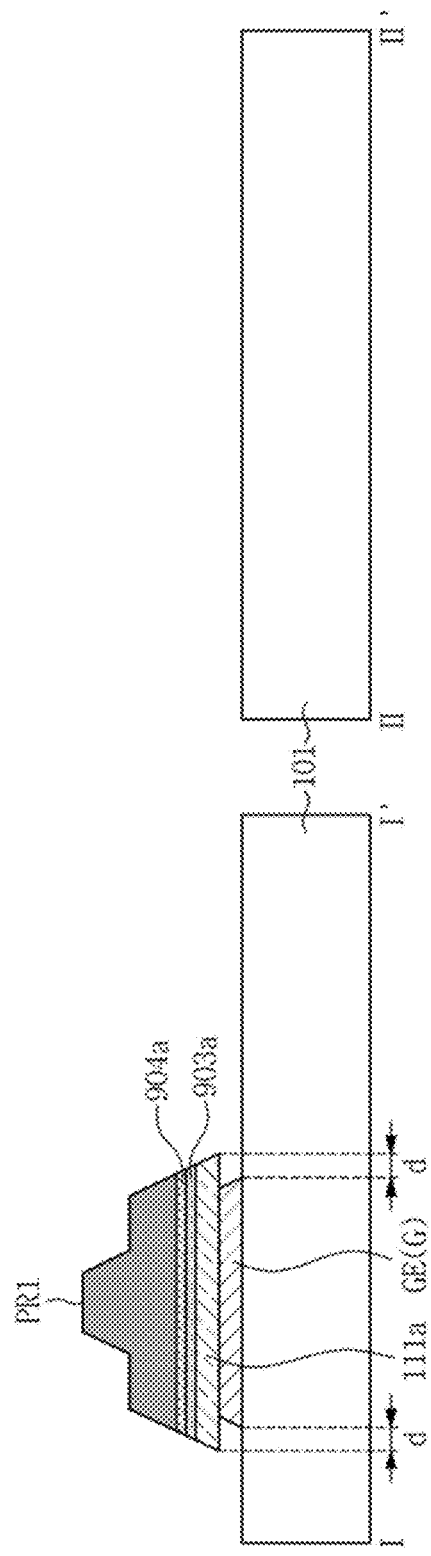
Figure 13:
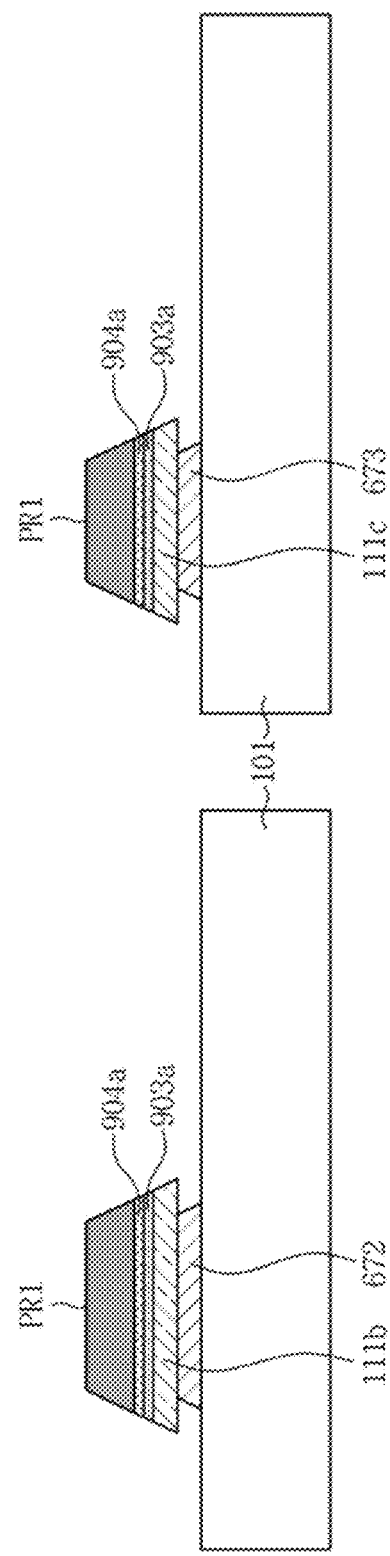

Subsequently, the ohmic contact material 904, the semiconductor material 903, the insulating material 902, and the gate material 901 may be sequentially etched, using the first photoresist pattern PR1 as a mask. Referring to FIGS. 12 and 13, the gate transmitting member G, the pad electrode 672, and the gate electrode 673 of the driving transistor may be formed on the lower substrate 101. The first gate insulating layer 111a, the second gate insulating layer 111b, and the third gate insulating layer 111c may be formed on the gate transmitting member G, the pad electrode 672, and the gate electrode 673 of the driving transistor, respectively. A semiconductor material pattern 903a may be formed on the first gate insulating layer 111a, the second gate insulating layer 111b, and the third gate insulating layer 111c, and a first ohmic contact material pattern 904a may be formed on the semiconductor material pattern 903a.

The gate material 901, the insulating material 902, the semiconductor material 903, and the ohmic contact material 904 not covered by the first photoresist pattern PR1 may be removed. A surface of the lower substrate 101 on which the first photoresist pattern PR1 is not formed may be exposed.

The insulating material 902, the semiconductor material 903, and the ohmic contact material 904 may be removed through a dry-etching method using an etching gas.

The gate material 901 may be removed through a wet-etching method using an etchant. The gate material 901 may be removed through an over-etching method, and the gate transmitting member G may have a smaller size than the size of the first gate insulating layer 111a. The over-etching may be performed for a time period about twice or more times the time period for which a general etching is performed. For example, referring to FIG. 12, when a shortest distance between a first virtual surface intersecting an end portion of a side surface of the first gate insulating layer 111a and being perpendicular to the lower substrate 101 and a second virtual surface intersecting an end portion of a side surface of the gate transmitting member G and being perpendicular to the lower substrate 101 is defined as "d," the gate material 901 may be over-etched, and the shortest distance "d" may be more than 0.3 µm. The shortest distance "d" may be in a range of from about 0.5 µm to about 0.8 µm.

When the gate material 901 is over-etched, the gate transmitting member G may have a size smaller than the size of the first gate insulating layer 111a, the pad electrode 672 may have a size smaller than the size of the second gate insulating layer 111b, and the gate electrode 673 of the driving transistor may have a size smaller than the size of the third gate insulating layer 111c.

Figure 14:
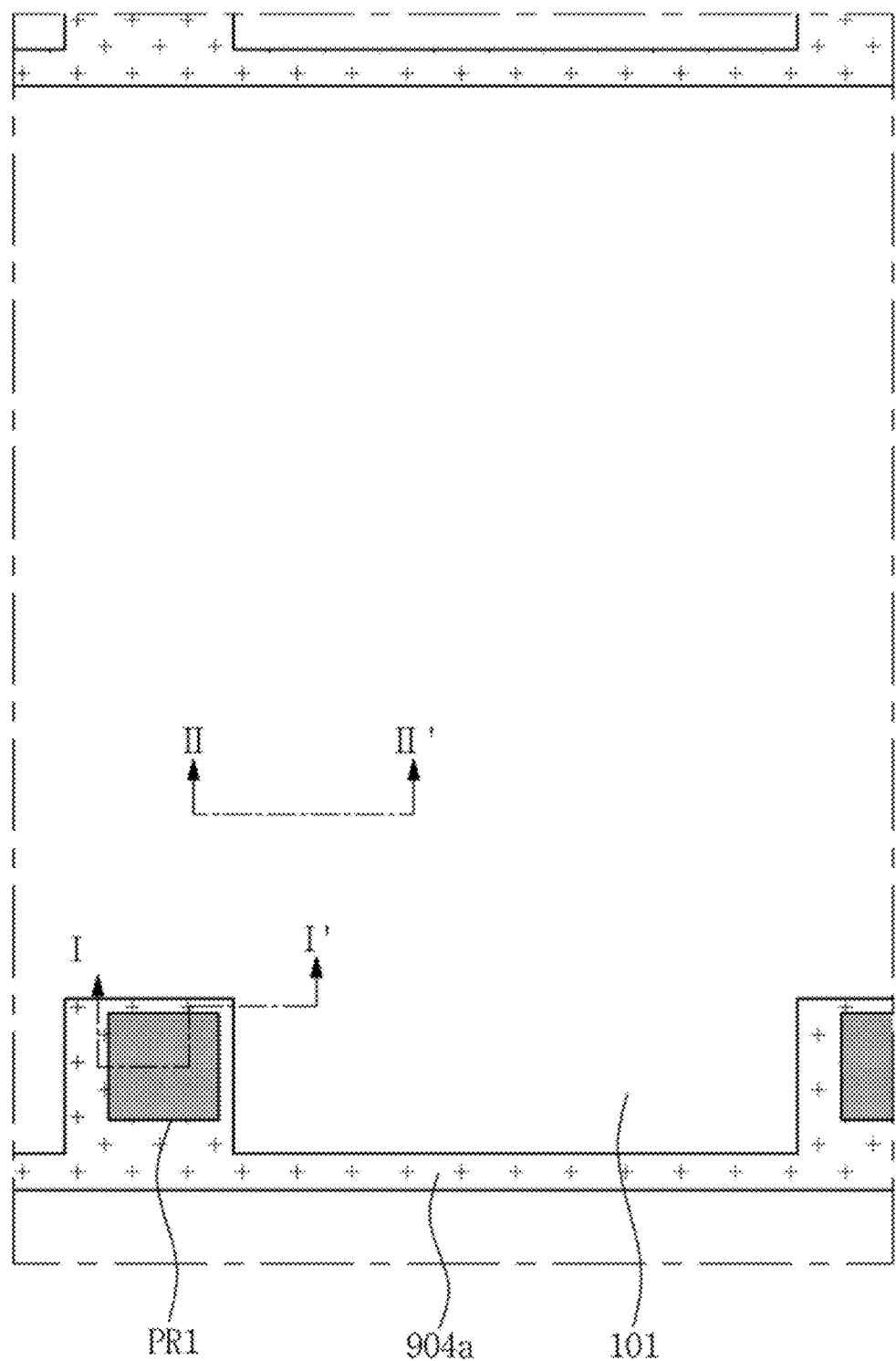
Figure 15:
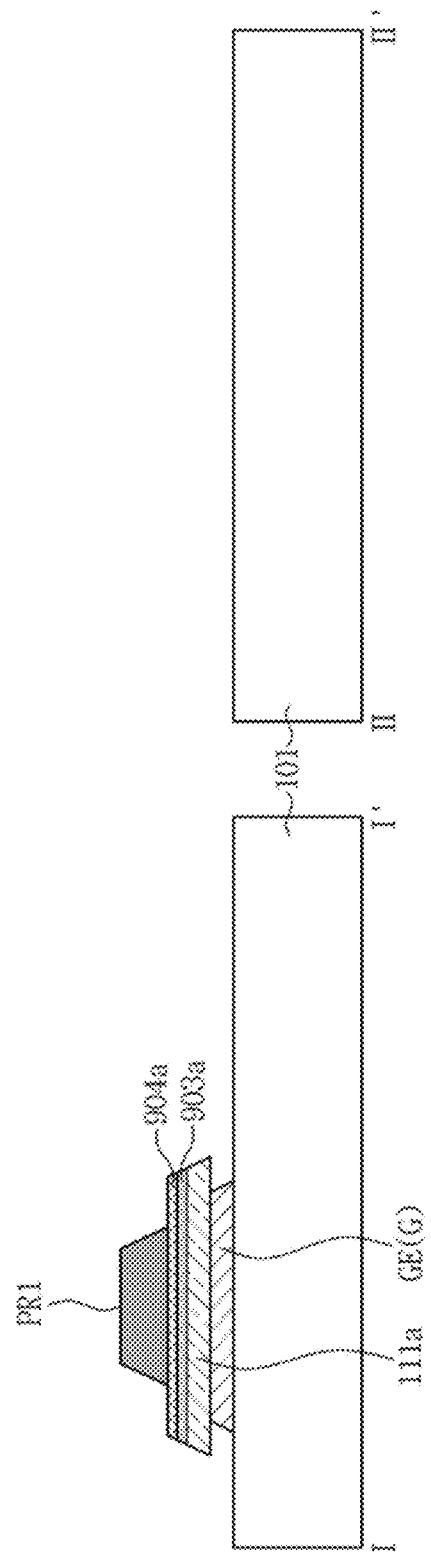
Figure 16:
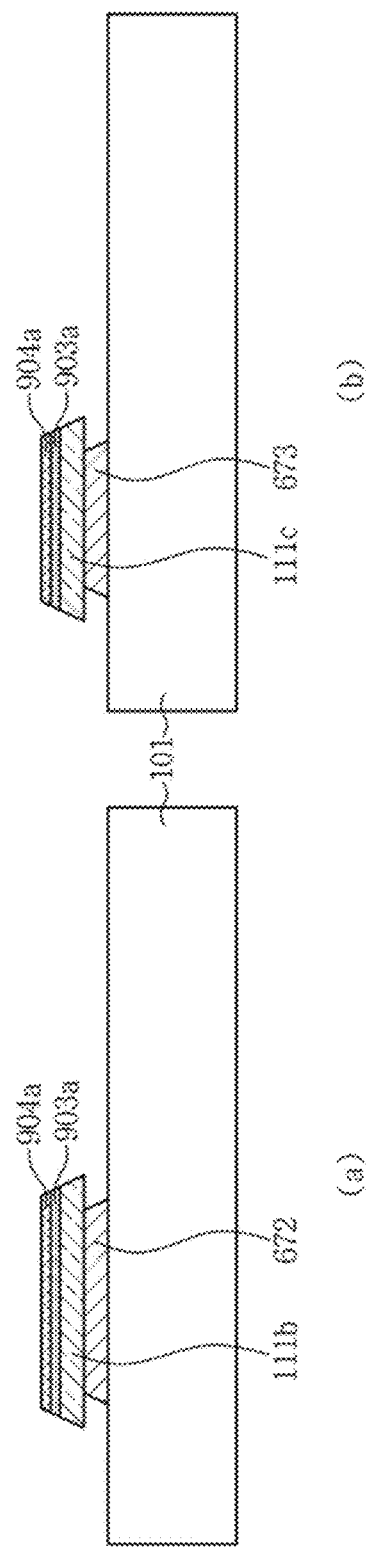

Referring to FIGS. 14, 15, and 16, the first photoresist pattern PR1 having a relatively small thickness on the pad electrode 672 and the gate electrode 673 of the driving transistor may be substantially completely removed by an aching process, and thus the first ohmic contact material pattern 904a on the pad electrode 672 and the gate electrode 673 may be substantially completely exposed. Referring to FIG. 15, the first photoresist pattern PR1 having a relatively large thickness on the gate transmitting member G may be partially removed, and thus the thickness of the first photoresist pattern PR1 may be reduced to about half of the original thickness.

Figure 17:
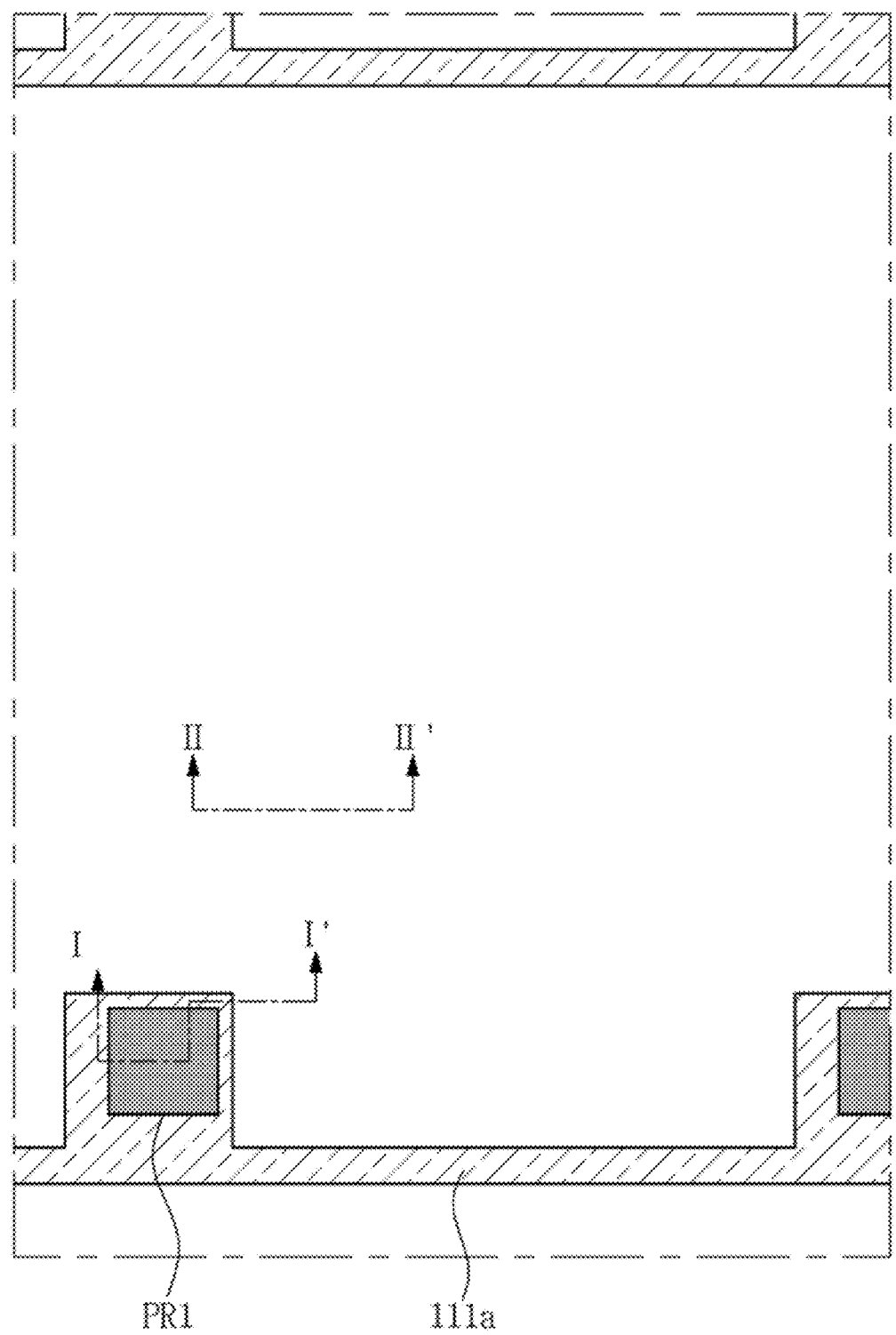
Figure 18:
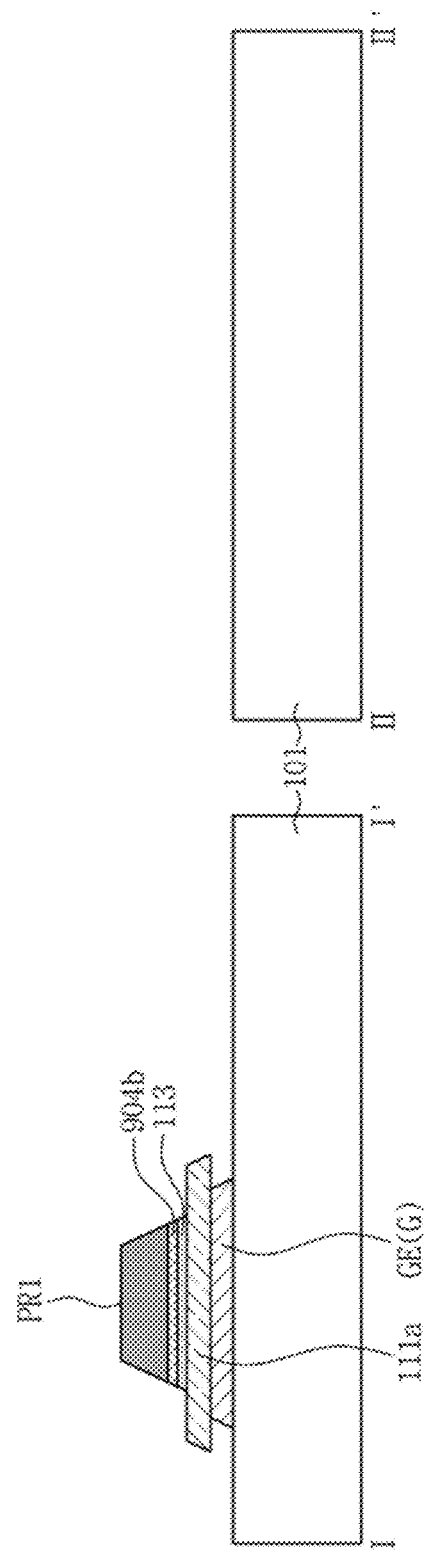
Figure 19:
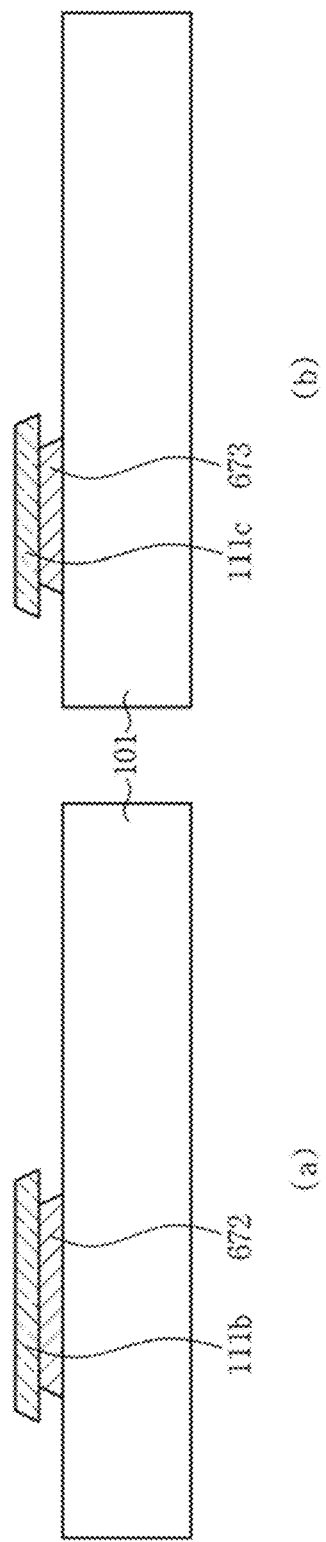

Referring to FIGS. 17, 18, and 19, the first ohmic contact material pattern 904a and the semiconductor material pattern 903a may be sequentially etched using the first photoresist pattern PR1, which may be ashed, as a mask. Referring to FIGS. 18 and 19, the semiconductor layer 113 may be formed on the first gate insulating layer 111a, and a second ohmic contact material pattern 904b may be formed on the semiconductor layer 113. Each of the semiconductor material pattern 903a and the first ohmic contact material pattern 904a formed on the second gate insulating layer 111b and the third gate insulating layer 111c may be removed by the etching process.

Subsequently, the first photoresist pattern PR1, which may be ashed, may be removed.

Figure 20:
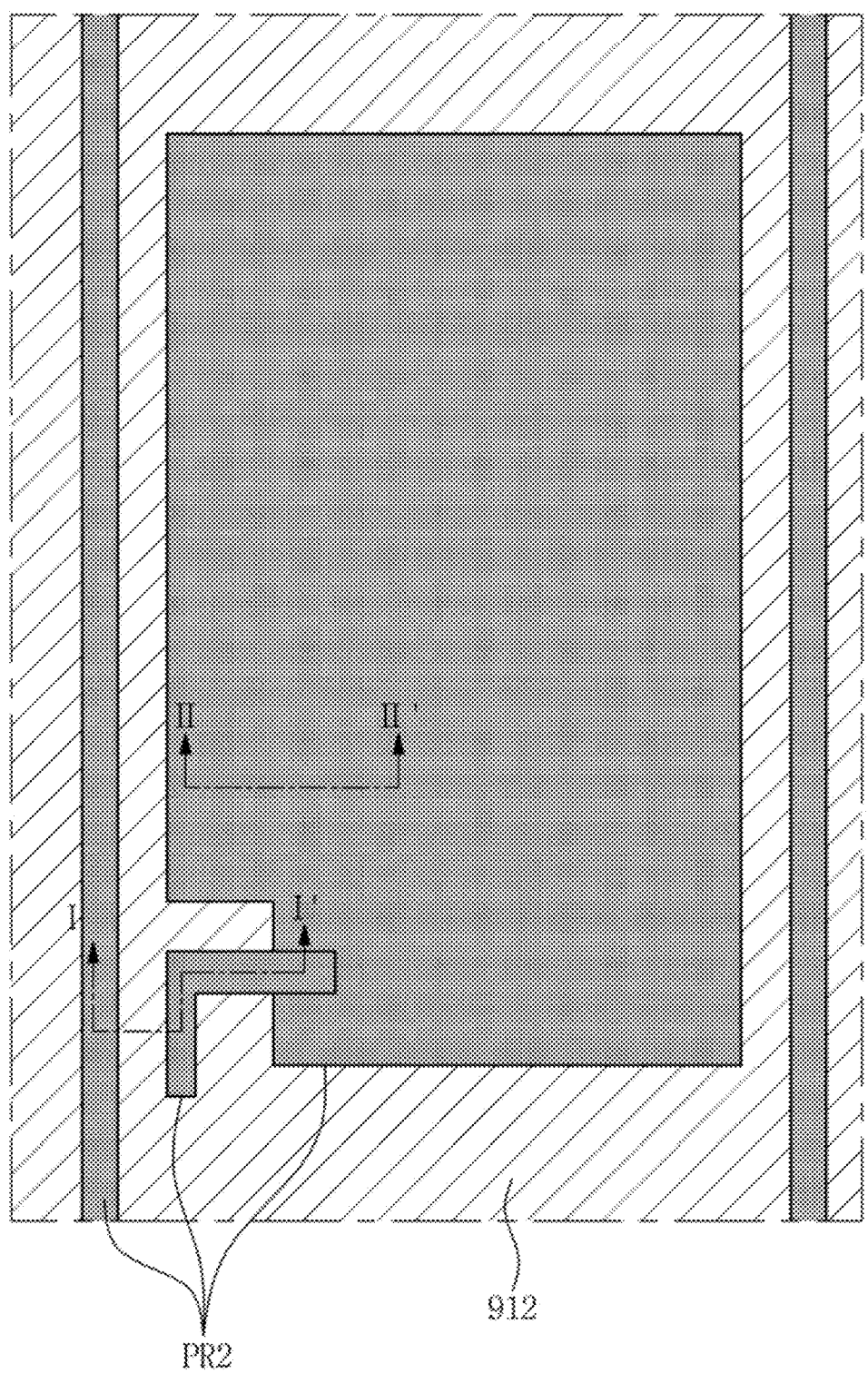
Figure 21:
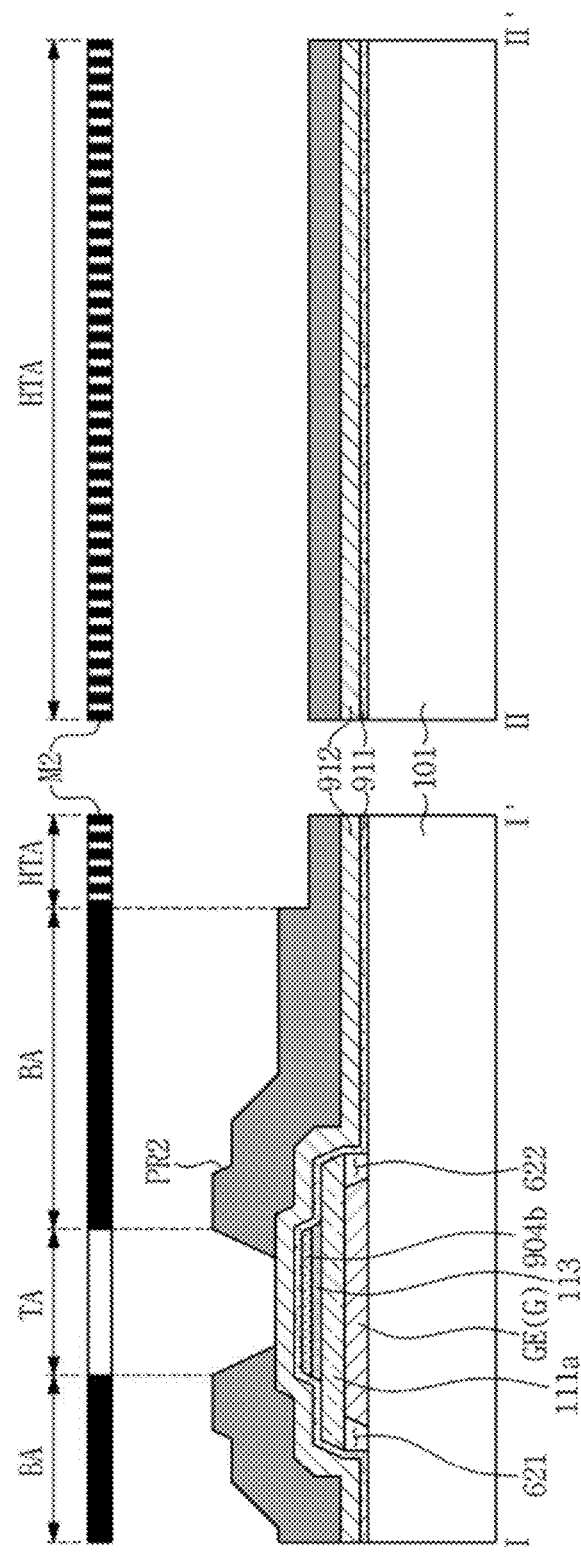
Figure 22:
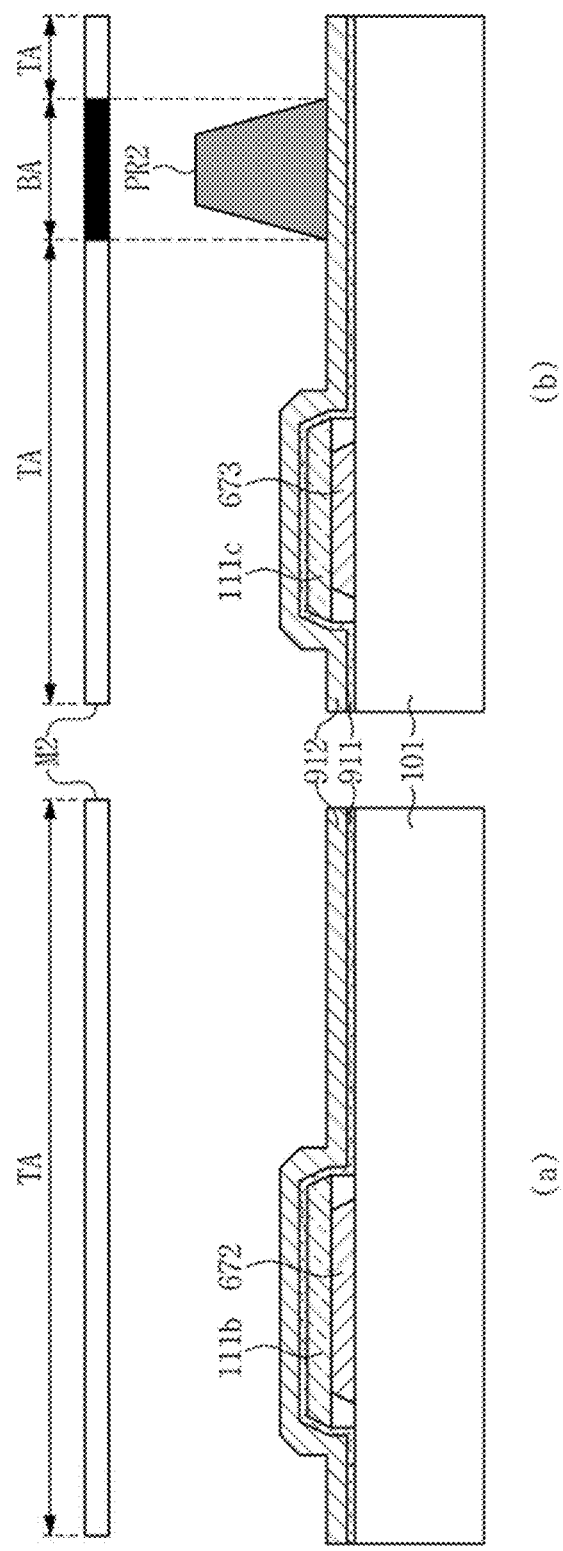
Figure 23:
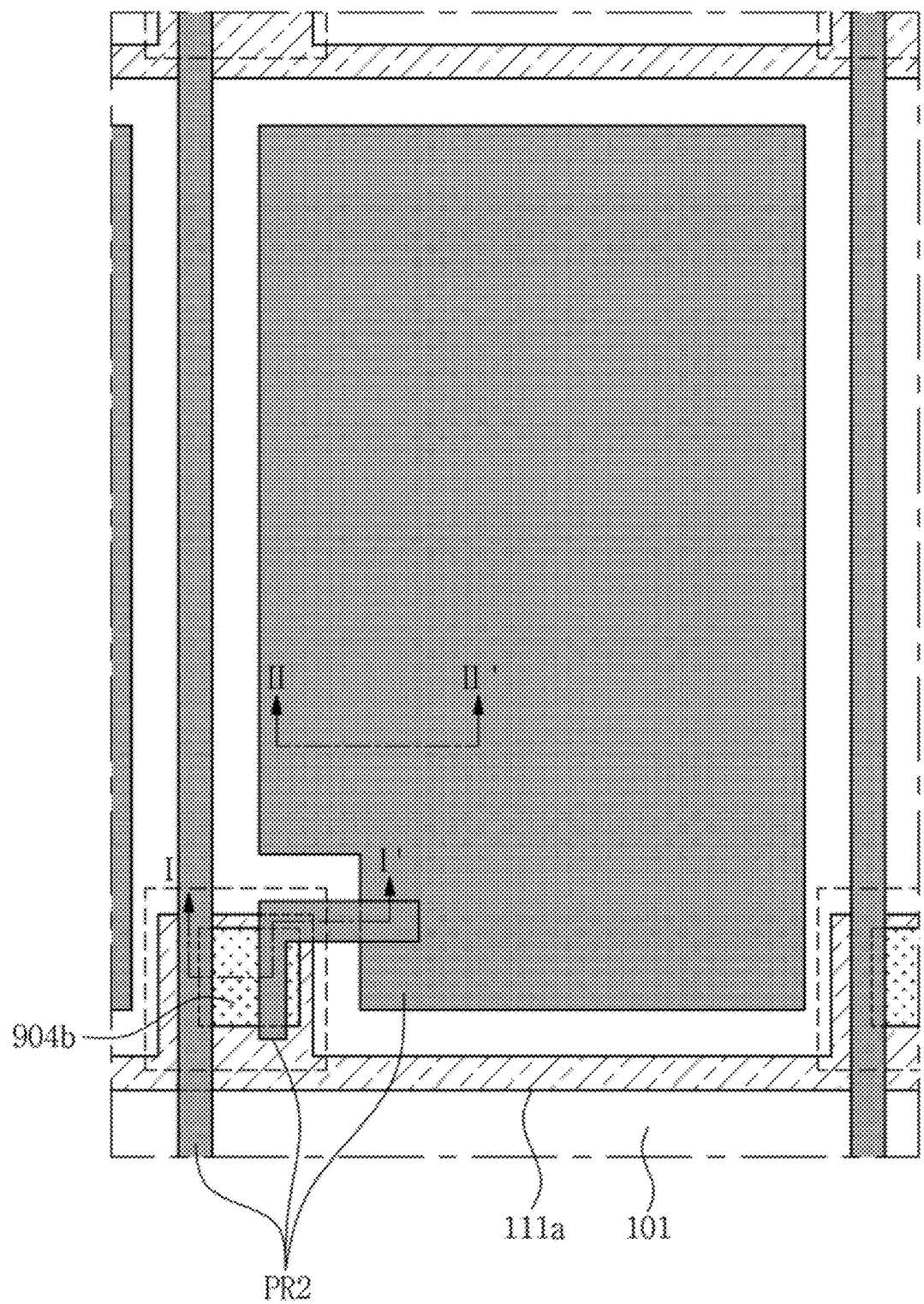

Referring to FIGS. 20, 21, and 22, a pixel material 911 and a data material 912 may be sequentially formed over substantially the entire surface of the lower substrate 101 including the first gate insulating layer 111a, the second gate insulating layer 111b, the third gate insulating layer 111c, and the second ohmic contact material pattern 904b. That is, after the pixel material 911 is formed over substantially the entire surface of the lower substrate 101 including the first gate insulating layer 111a, the second gate insulating layer 111b, the third gate insulating layer 111c, and the second ohmic contact material pattern 904b, the data material 912 may be formed over substantially the entire surface of the lower substrate 101 including the pixel material 911.

The pixel material 911 and the data material 912 may be formed on the lower substrate 101 by a physical vapor deposition PVD method such as sputtering.

A second photoresist may be formed over substantially the entire surface of the lower substrate 101 including the data material 912.

Referring to FIGS. 21 and 22, a second mask M2 may be disposed on the second photoresist. The second mask M2 may include the transmission area TA through which light is transmitted, the blocking area BA through which light is not transmitted, and a half-transmission area HTA through which light is partially transmitted. The half-transmission area HTA may include a plurality of slits or a half-transparent layer.

Light, such as UV light, may be selectively radiated onto the second photoresist through the second mask M2, and thus the second photoresist may be exposed to light. When the second photoresist which is exposed to light is developed, a second photoresist pattern PR2 including patterns having different thicknesses from one another may be formed on the data material 912. A portion (or a fourth pattern) of the second photoresist pattern PR2 corresponding to the blocking area BA of the second mask M2 may have a thickness larger than the thickness of a portion (or a third pattern) of the second photoresist pattern PR2 corresponding to the half-transmission area HTA of the second mask M2. A portion of the second photoresist pattern PR2 corresponding to the transmission area TA of the second mask M2 may be removed.

The second photoresist pattern PR2 may be formed on a portion of the data material 912 where the data transmitting member D and the pixel electrode 144 may be formed. A portion of the second photoresist pattern PR2 having a relatively large thickness may be formed on a portion of the data material 912 where the data transmitting member ID and the source electrode and a drain electrode of the driving transistor may be formed.

Figure 24:
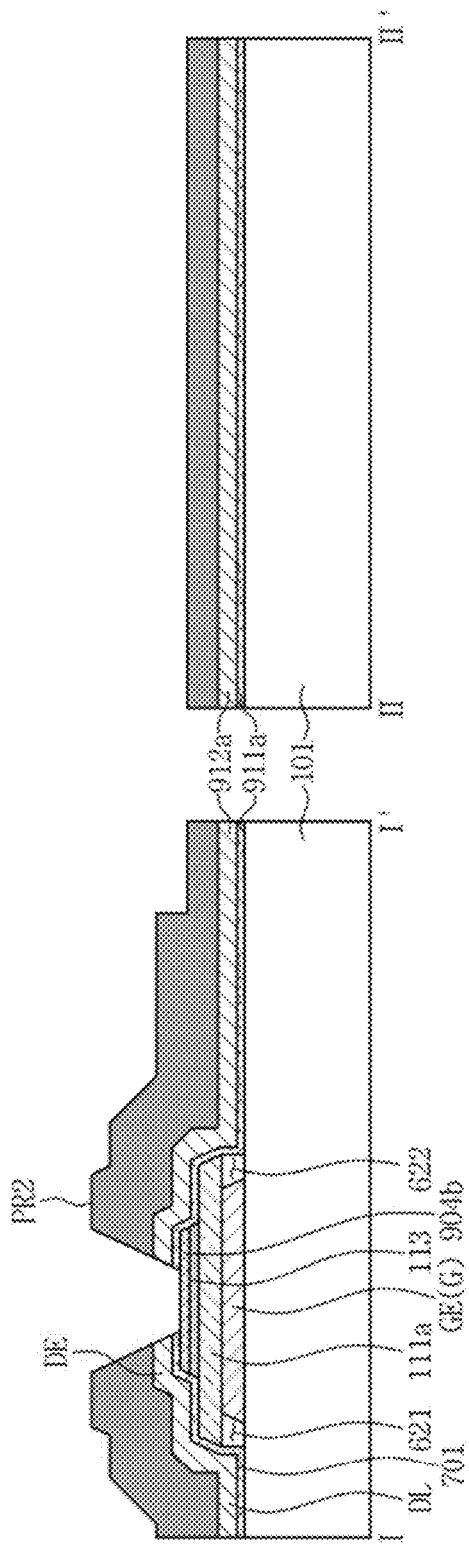
Figure 25:
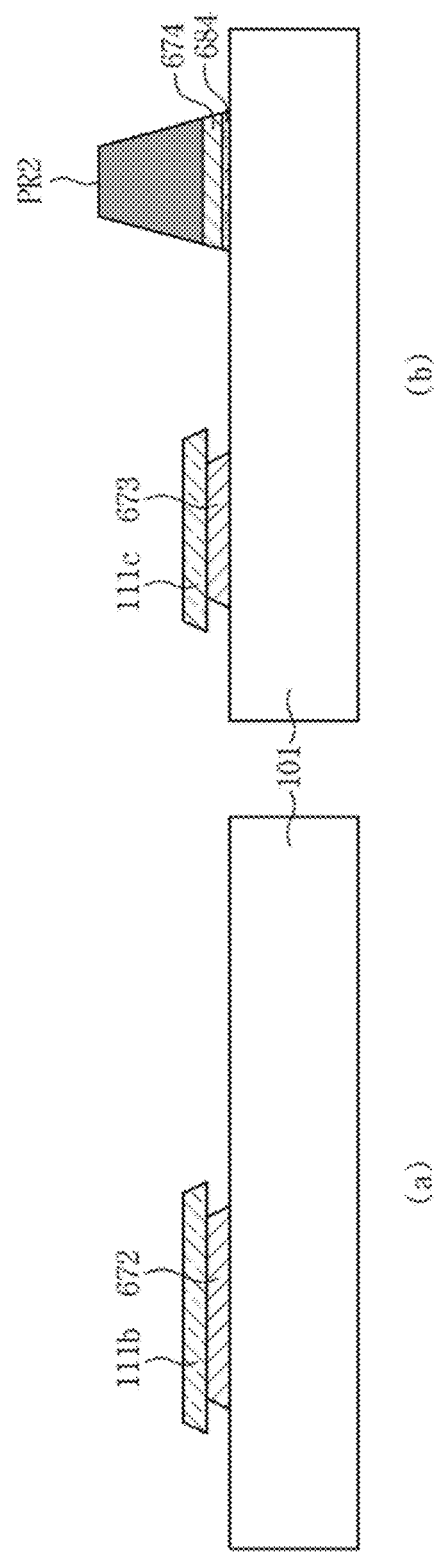

Subsequently, the data material 912 and the pixel material 911 may be sequentially etched using the second photoresist pattern PR2 as a mask. Referring to FIGS. 24 and 25, the dummy pattern 701, a pixel material pattern 911a, and the dummy drain electrode 684 may be formed on the lower substrate 101. A data line DL and a drain electrode DE may be formed on the dummy pattern 701. A data material pattern 912a may be formed on the pixel material pattern 911a. The drain electrode 674 of the driving transistor may be formed on the dummy drain electrode 684. The gap 621 may be formed between the gate transmitting member G and the dummy pattern 701. The gap 622 may be formed between the gate transmitting member G and the pixel material pattern 911a.

The pixel material 911 and the data material 912 may be removed in portions of the LCD device that are not covered by the second photoresist pattern PR2. A surface of the lower substrate 101 may be exposed where the pixel material 911 and the data material 912 are removed.

The pixel material 911 and the data material 912 may be removed through a wet-etching method.

Figure 26:
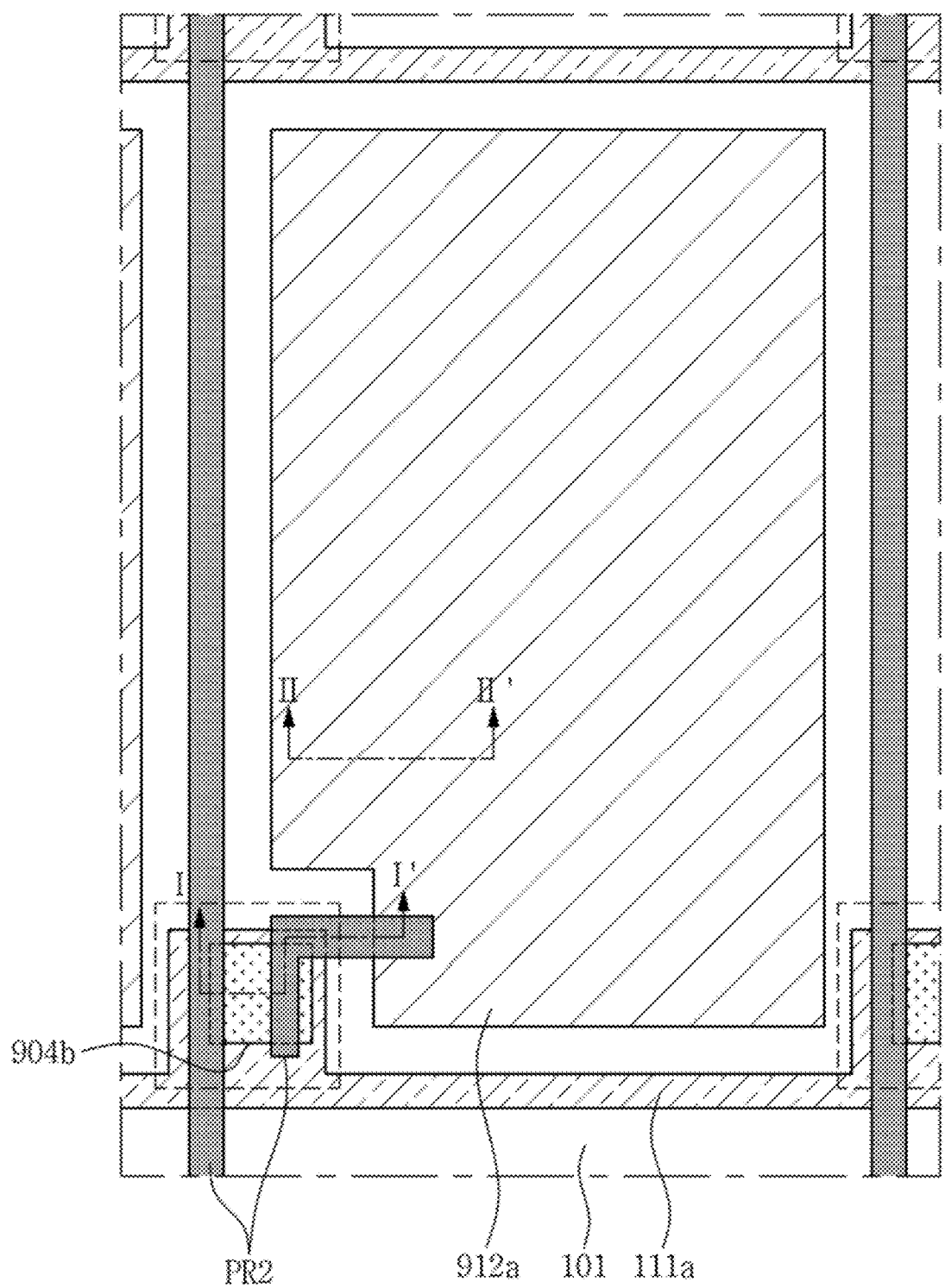
Figure 27:
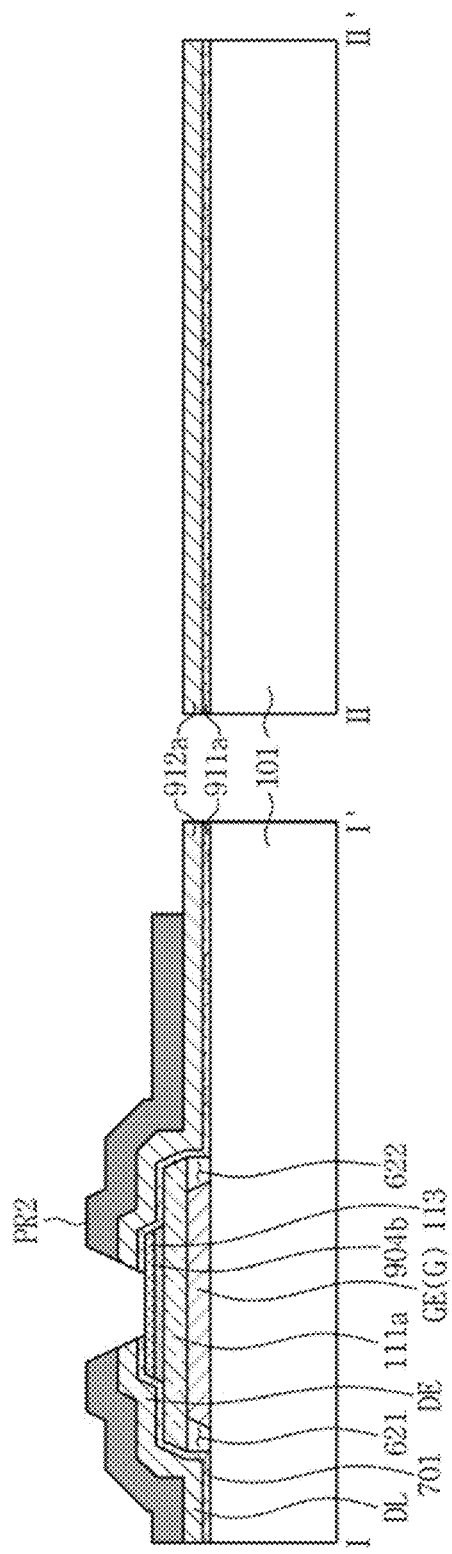
Figure 28:
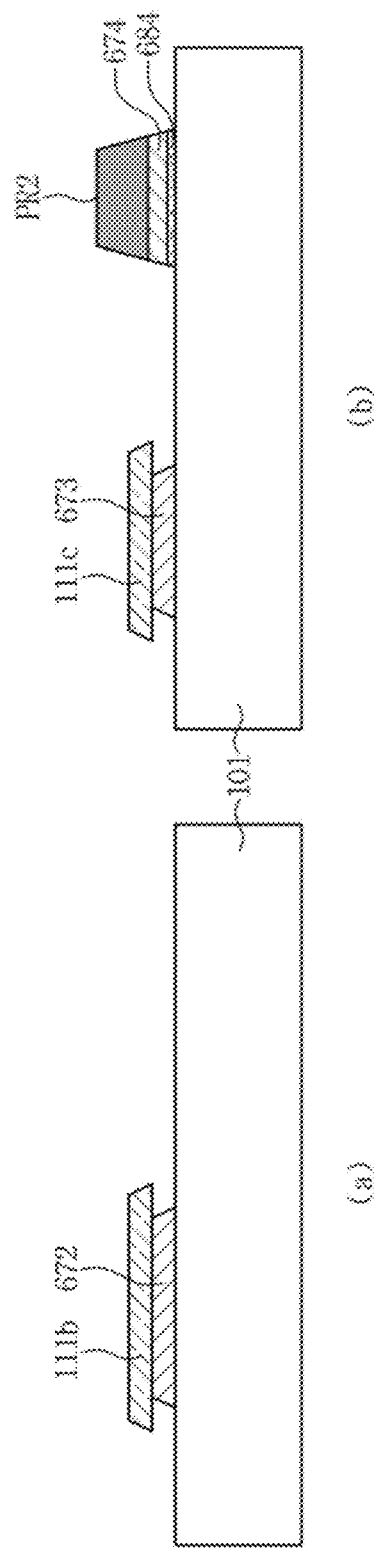

Referring to FIGS. 26, 27, and 28, the second photoresist pattern PR2 having a relatively small thickness in the pixel region P may be substantially completely removed through the ashing process, and thus the data material 912 in the pixel region P may be substantially completely exposed. The second photoresist pattern PR2 having a relatively large thickness on the data line DL, the drain electrode DE, the data material 912 outside the pixel region P, and the drain electrode 674 of the driving transistor may be partially removed, and thus the thickness of the second photoresist pattern PR2 may reduced to about half of the original thickness. At least a portion of the second ohmic contact material pattern 904b in the channel region may be removed by the ashing process.

Figure 29:
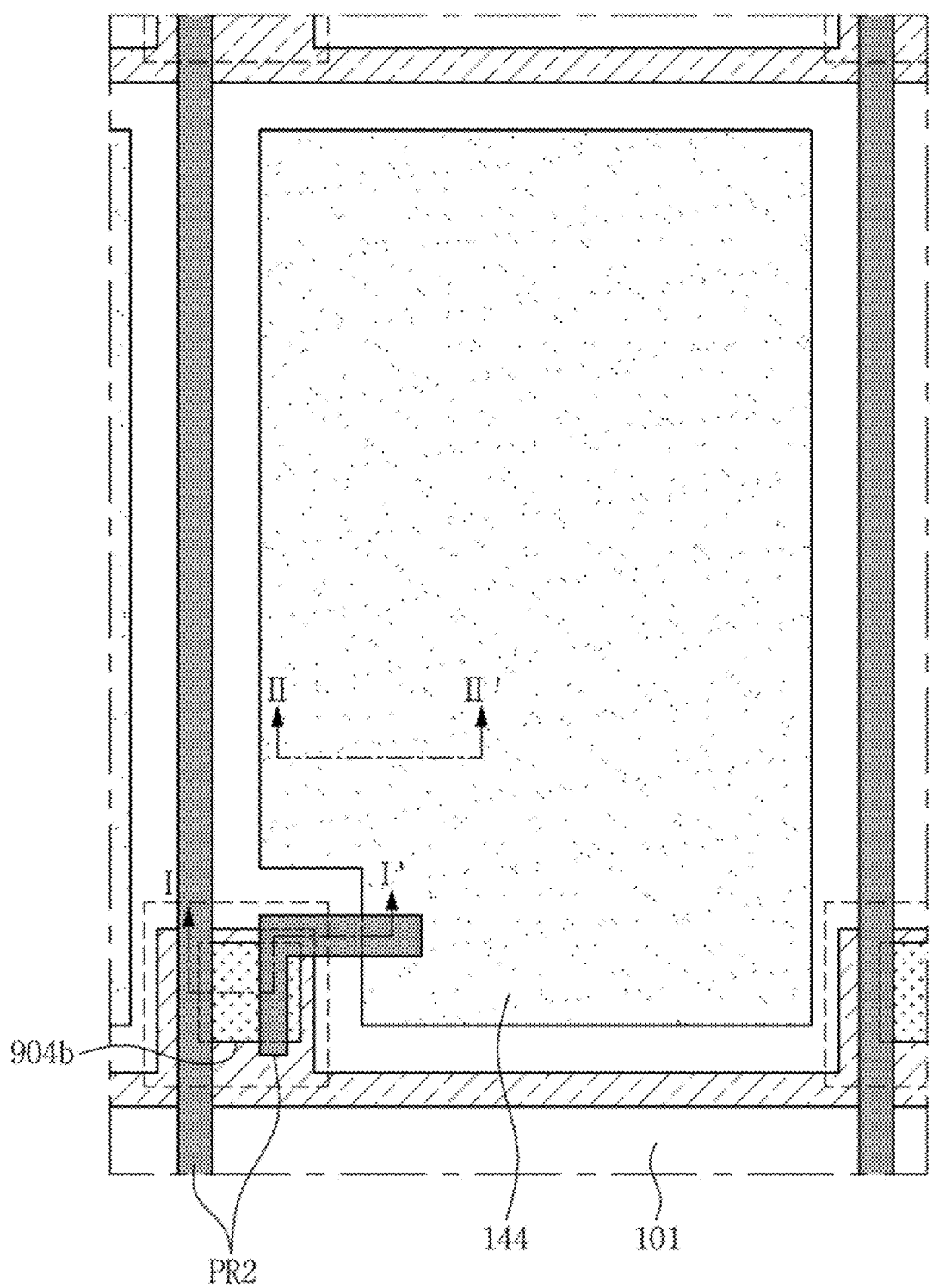
Figure 30:
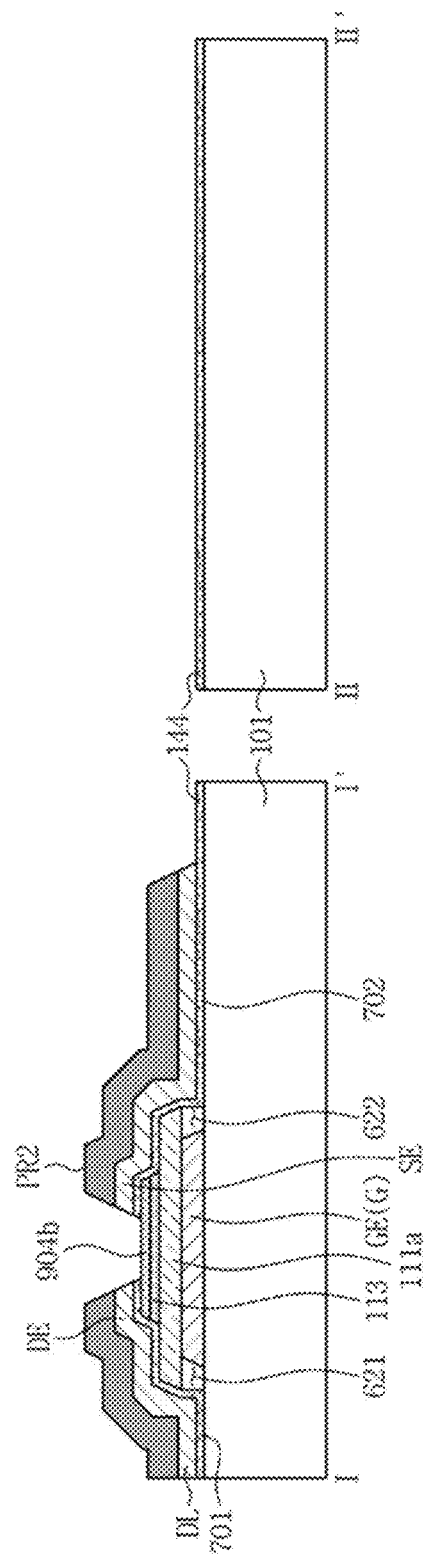

Referring to FIGS. 29 and 30, the data material 912 may be etched using the second photoresist pattern PR2, which may be ashed, as a mask. The pixel electrode 144 including the connecting portion 702 may be formed in the pixel region P, and the source electrode SE may be formed on the connecting portion 702.

Figure 31:
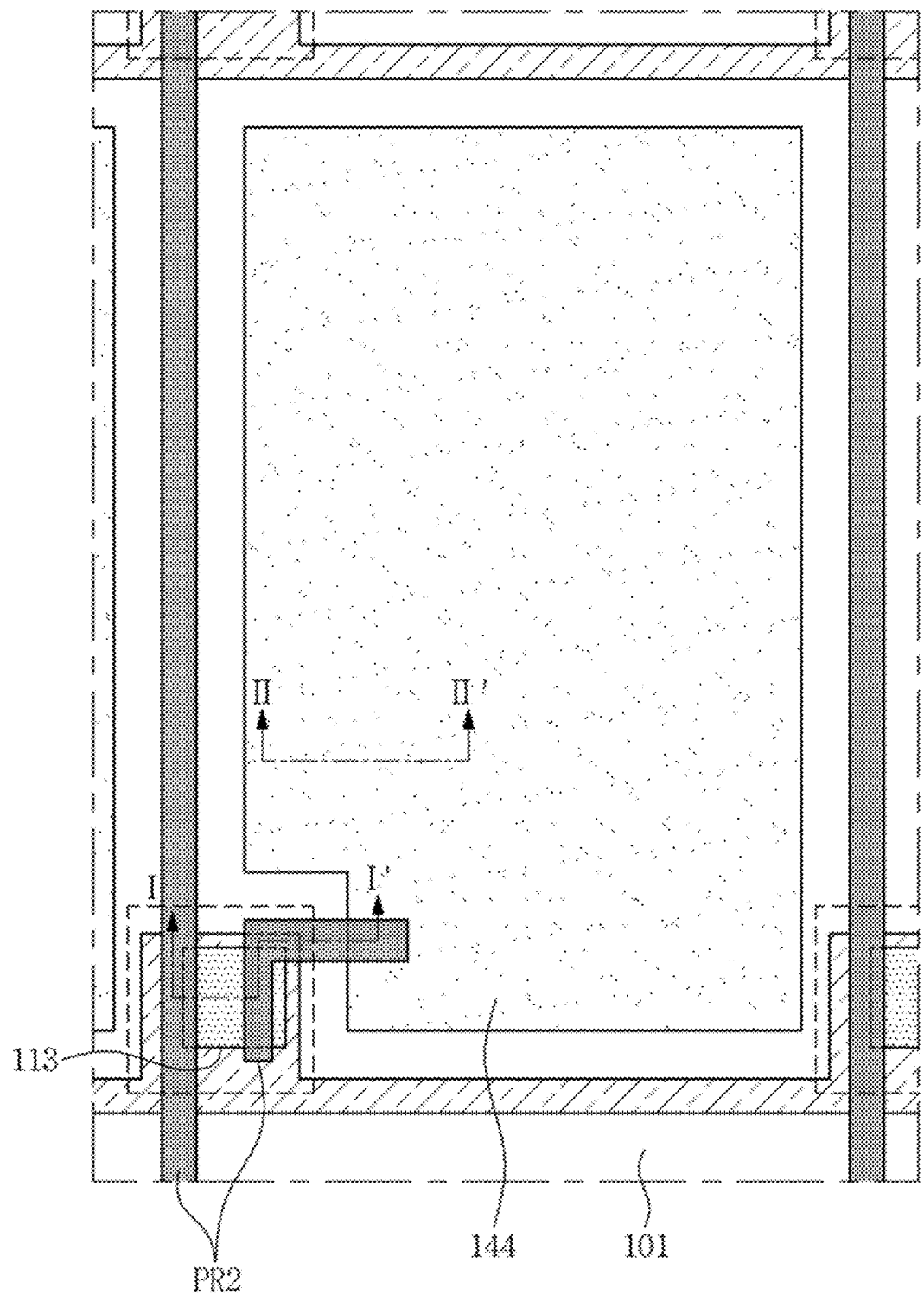
Figure 32:
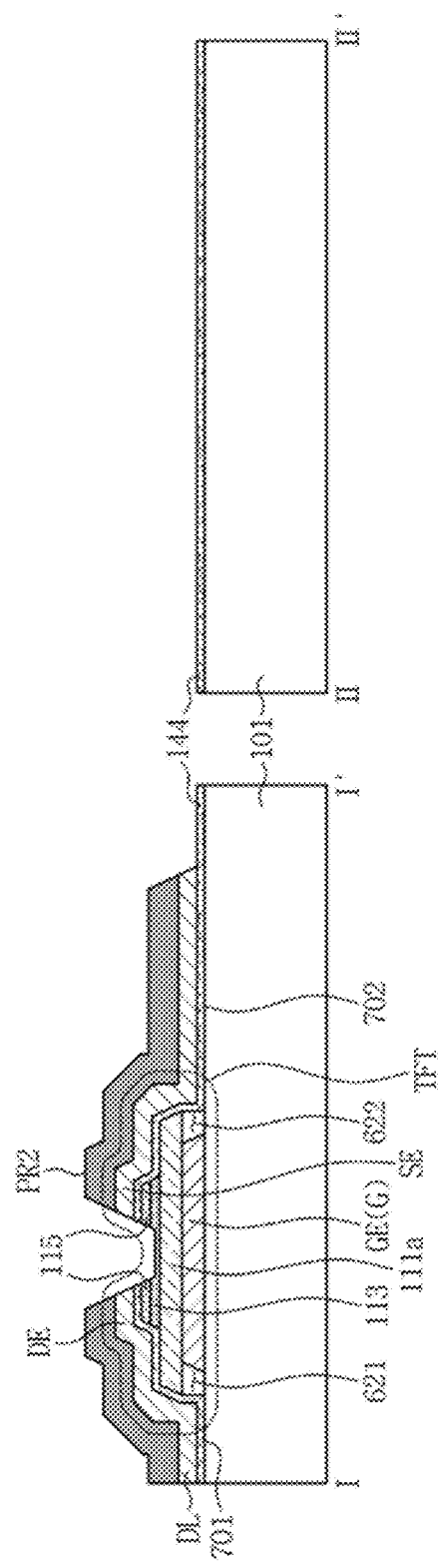
Figure 33:
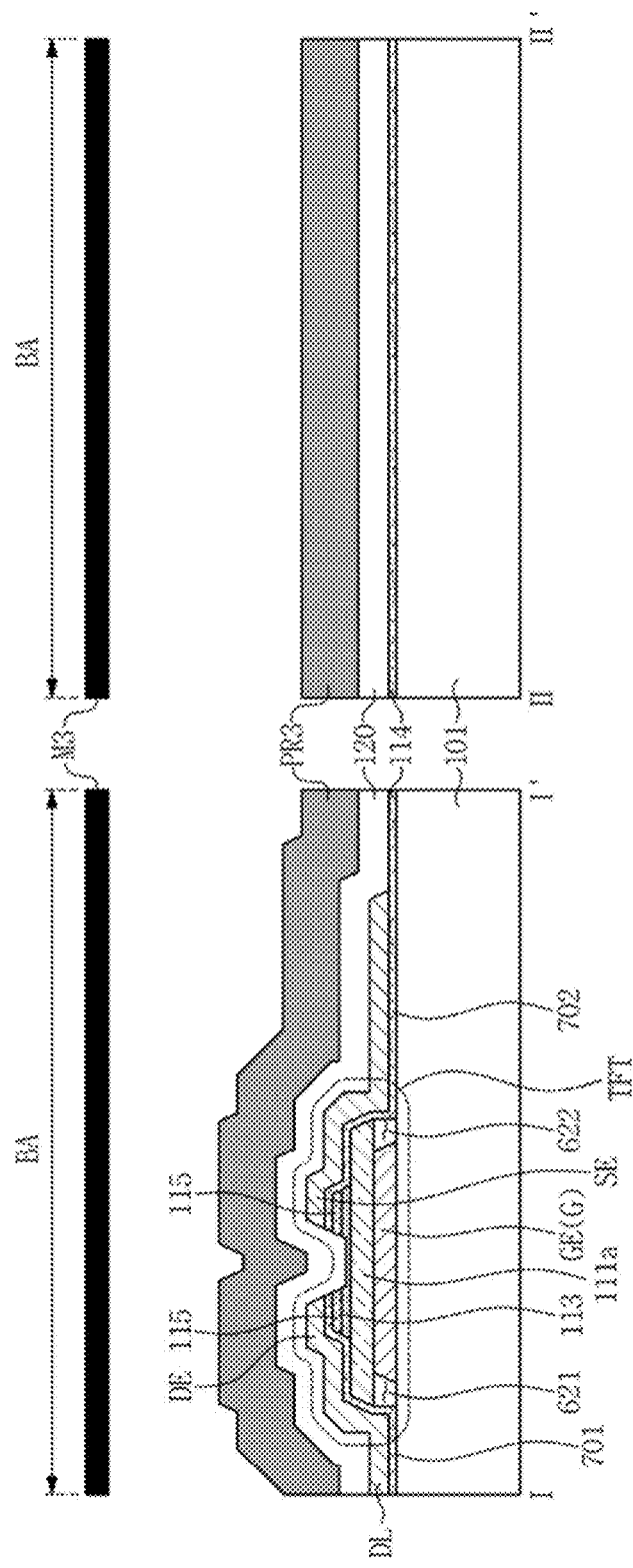

Referring to FIGS. 31, 32, and 33, the second ohmic contact material pattern 904b may be etched using the second photoresist pattern PR2, which may be ashed, as a mask. Referring to FIG. 32, the ohmic contact layer 115 may be formed, and a channel of the pixel TFT may be formed. In the process of forming the ohmic contact layer 115, the semiconductor layer 113 in the channel may be partially removed.

Subsequently, the second photoresist pattern PR2 may be removed. The second photoresist pattern PR2 may be removed after the pixel electrode 144 and source electrode SE are formed. The ohmic contact layer 115 may be formed by using the data transmitting member D as a mask.

Figure 34:
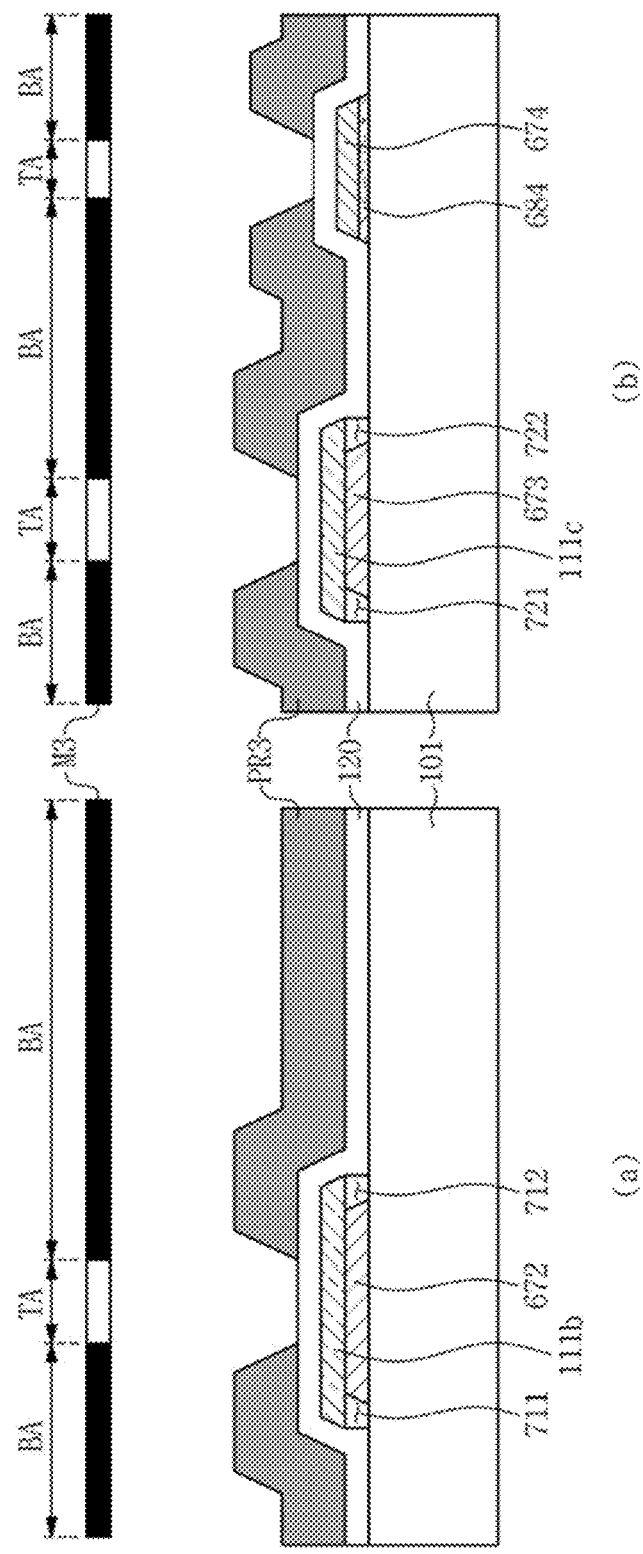
Figure 35:
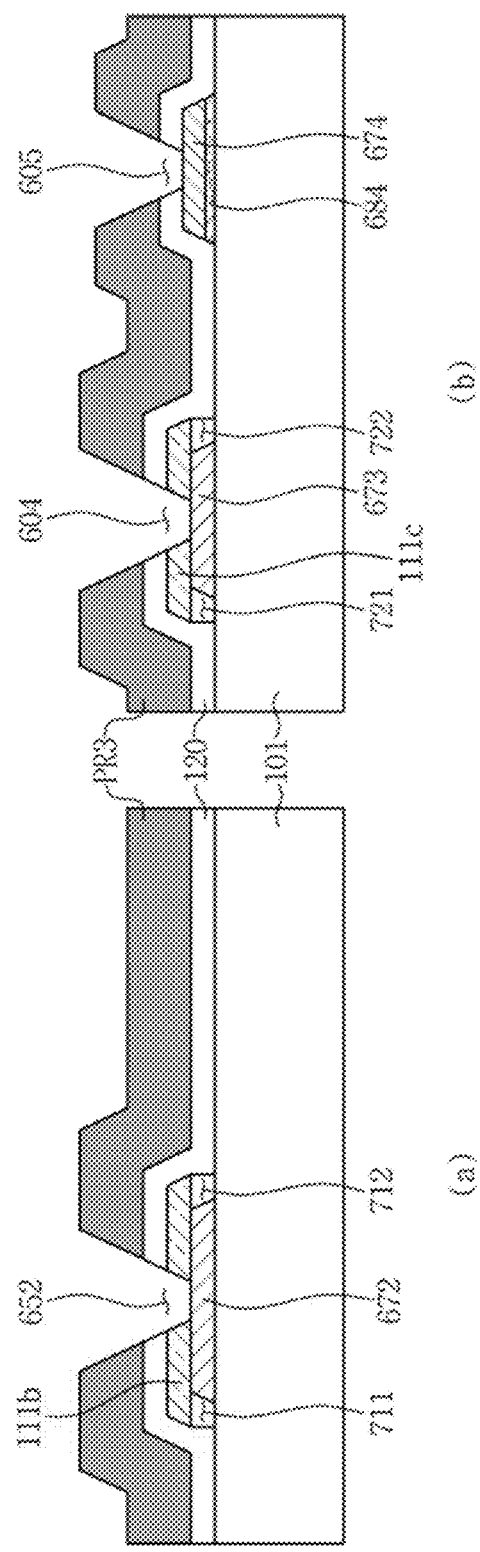

Referring to FIGS. 33 and 34, the passivation layer 120 may be formed over substantially the entire surface of the lower substrate 101 including the data transmitting member D, the pixel electrode 144, the first gate insulating layer 111a, the second gate insulating layer 111b, and the third gate insulating layer 111c.

A third photoresist may be formed over substantially the entire surface of the lower substrate 101 including the passivation layer 120.

A third mask M3 may be disposed on the third photoresist. The third mask M3 may include the transmission area TA through which light is transmitted and the blocking area BA through Which light is not transmitted.

Light, such as UV light, may be selectively radiated onto the third photoresist through the third mask M3, and thus the third photoresist may be exposed to light. When the third photoresist, which may be exposed to light, is developed, a third photoresist pattern PR3 may be formed on the passivation layer 120.

The passivation layer 120, the second gate insulating layer 111b, and the third gate insulating layer 111c may be etched using the third photoresist pattern PR3 as a mask. The pad contact hole 652 exposing the pad electrode 672 may be formed in the second gate insulating layer 111b and the passivation layer 120. The gate contact hole 604 exposing the gate electrode 673 of the driving transistor may be formed in the third gate insulating layer 111c and the passivation layer 120. The drain contact hole 605 exposing the drain electrode 674 of the driving transistor may be formed on the passivation layer 120.

The passivation layer 120, the second gate insulating layer 111b, and the third gate insulating layer 111c may be removed through a dry-etching method.

The third photoresist pattern PR3 may be removed.

Figure 36:
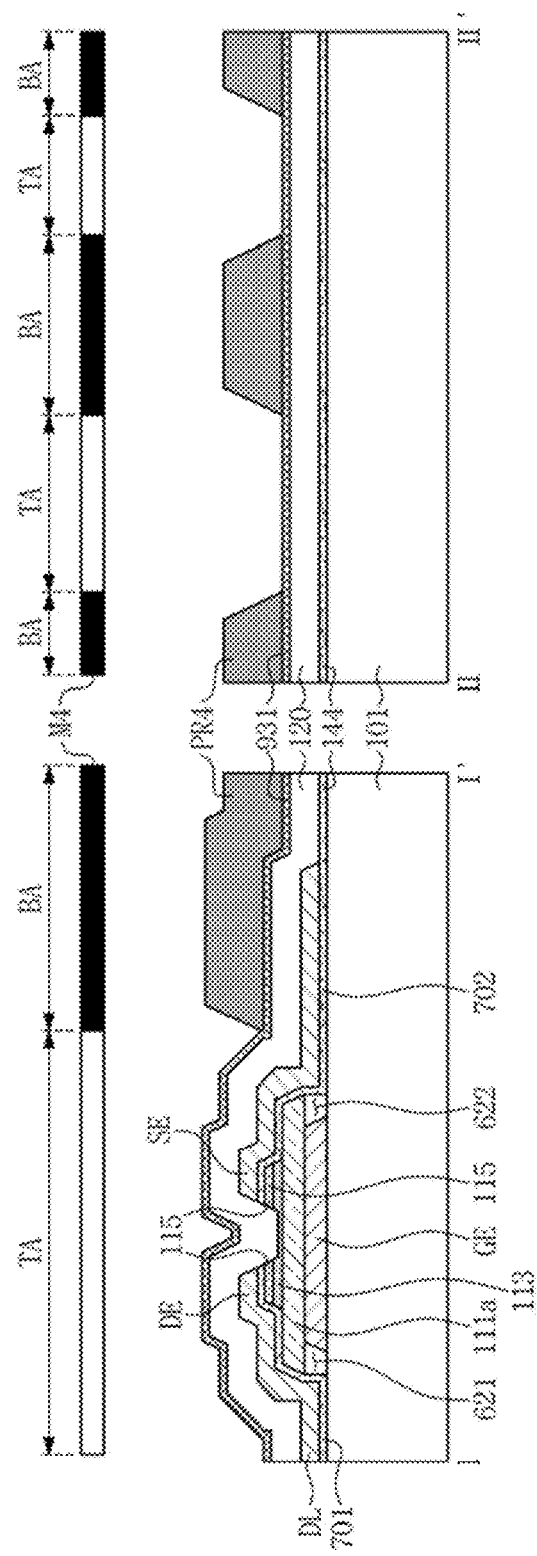
Figure 37:
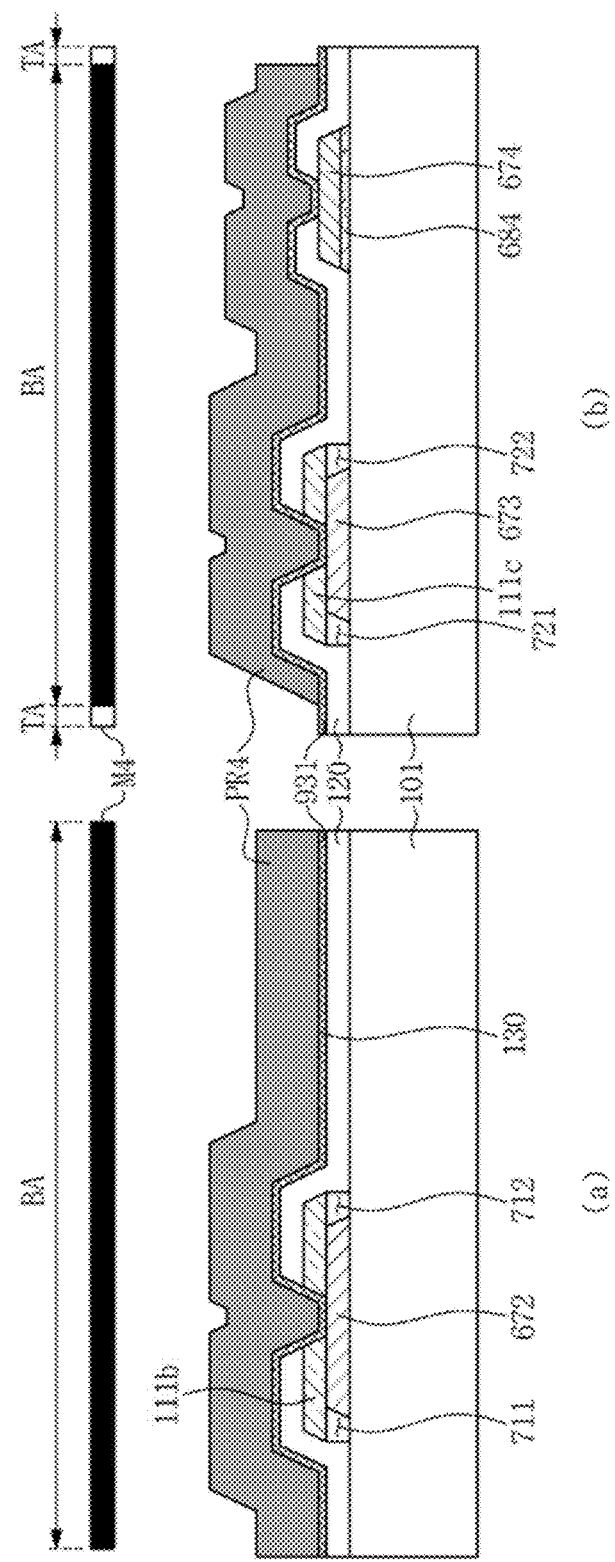

Referring to FIGS. 36 and 37, a common material 931 may be formed over substantially the entire surface of the lower substrate 101 including the passivation layer 120.

A fourth photoresist may be formed over substantially the entire surface of the lower substrate 101 including the common material 931.

A fourth mask M4 may be disposed on the fourth photoresist. The fourth mask M4 may include the transmission area TA through which light is transmitted and the blocking area BA through which light is not transmitted.

Light, such as UV light, may be selectively radiated onto the fourth photoresist through the fourth mask M4, and thus the fourth photoresist may be exposed to light. When the fourth photoresist, which may be exposed to light, is developed a fourth photoresist pattern PR4 may be formed on the common material 931.

Figure 38:
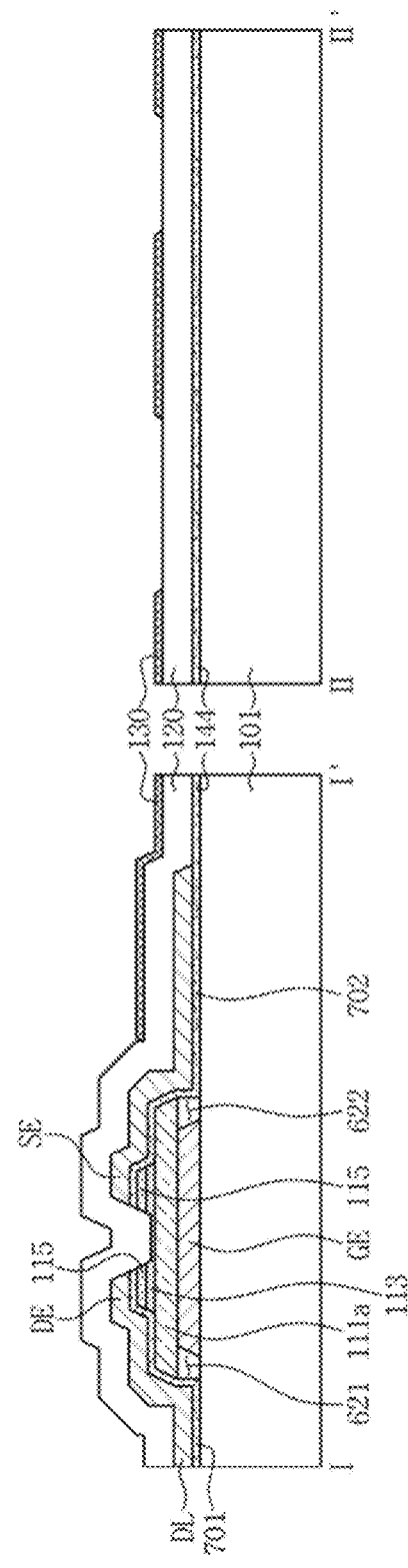
Figure 39:
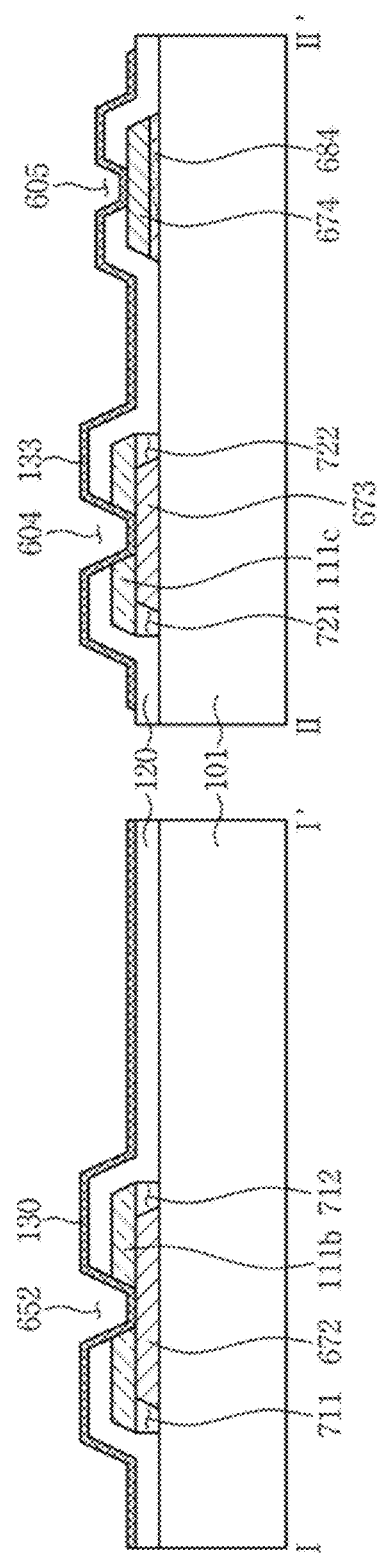

The common material 931 may be etched using the fourth photoresist pattern PR4 as a mask. Referring to FIGS. 38 and 39, the common electrode 130 having the slit 404 and the aperture 405 and being connected to the pad electrode 672 may be formed on the passivation layer 120. A bridge electrode connecting the gate electrode 673 and the drain electrode 674 of the driving transistor may be formed on the passivation layer 120.

In the LCD device according to exemplary embodiments of the present invention, the gate transmitting member and the semiconductor layer may be fabricated together in a single mask process. The data transmitting member and the pixel electrode may be fabricated together in a single mask process. Accordingly, the number of masks used may be reduced, and thus manufacturing costs may be reduced.

The semiconductor layer may only be disposed on the gate electrode, and thus light supplied from a backlight might not reach the semiconductor layer. Accordingly, activation of the semiconductor layer by light emitted from the backlight may be reduced or prevented, and thus defects such as a waterfall phenomenon may be reduced or eliminated.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A method of fabricating a liquid crystal display device, the method comprising:
    forming a gate material, an insulating material, a semiconductor material, and an ohmic contact material on a first substrate;
    forming a first photoresist pattern on the ohmic contact material using a first mask
    wherein the first photoresist pattern comprises first and second patterns having different thickness from one another;
    removing the ohmic contact material, the semiconductor material, and the insulating material using the first photoresist pattern as a mask;
    removing the gate material by an over-etching method using the first photoresist pattern as a mask, and forming a gate transmitting member, a first gate insulating layer, a semiconductor material pattern, and a first ohmic contact material pattern;
    removing the first pattern having a smaller thickness than the second pattern;
    removing the semiconductor material pattern and the first ohmic contact material pattern using the second pattern of the first photoresist pattern as a mask, and forming a semiconductor layer and a second ohmic contact material pattern; and forming a data transmitting member overlapping the semiconductor layer and a pixel electrode connected to the data transmitting member, wherein the first gate insulating layer has substantially a same shape as a shape of the gate transmitting member in a plan view.

2. The method of claim 1, wherein the forming of the data transmitting member and the pixel electrode comprises:

forming a pixel material and a data material on substantially an entire surface of the first substrate comprising the first gate insulating layer and the second ohmic contact material pattern;

forming a second photoresist pattern on the data material using a second mask, wherein the second photoresist pattern exposes a channel region of the semiconductor layer, and wherein the second photoresist pattern comprises third and fourth patterns having different thickness from one another;

removing the pixel material and the data material using the second photoresist pattern as a mask, and forming a dummy pattern, a pixel material pattern, a data line, a drain electrode, and a data material pattern;

removing the third pattern having a smaller thickness than the fourth pattern; and removing the data material using the fourth pattern of the second photoresist pattern as a mask, and forming the pixel electrode and a source electrode.

3. The method of claim 2, further comprising:

removing the second ohmic contact material pattern in the channel region using the fourth pattern of the second photoresist pattern as a mask, and forming an ohmic contact layer.

4. The method of claim 3, further comprising:

forming a passivation layer on substantially an entire surface of the first substrate comprising the gate transmitting member, the first gate insulating layer, the semiconductor layer, the data transmitting member, and the pixel electrode; and forming a common electrode on the passivation layer, wherein the common electrode comprises a slit exposing a portion of the pixel electrode and an aperture exposing at least a portion of the gate transmitting member.

5. The method of claim 1, wherein the first gate insulating layer has substantially a same shape as a shape of the gate transmitting member.

6. The method of claim 5, wherein the first gate insulating layer has a size greater than a size of the gate transmitting member.

7. The method of claim 1, wherein a gap is provided between the first gate insulating layer and the first substrate.

8. The method of claim 2, wherein the dummy pattern is disposed below the data line and below the drain electrode, wherein the dummy pattern has substantially a same shape as shapes of the data line and the drain electrode, respectively.

9. The method of claim 8, wherein a gap is surrounded by the first substrate, the first gate insulating layer, the dummy pattern and the gate transmitting member.

10. The method of claim 8, wherein the dummy pattern is disposed on a same layer as a layer on which the pixel electrode is disposed.

11. The method of claim 1, wherein the removing of the ohmic contact material, the semiconductor material, and the insulating material using the first photoresist pattern is performed by using a dry-etching method.

12. The method of claim 11, wherein the removing of the gate material by the over-etching method is performed by using a wet-etching method.

13. The method of claim 1, wherein a side surface of the gate transmitting member is spaced apart from a side surface of the first gate insulating layer.

14. The method of claim 1, wherein the first pattern is integrally formed with the second pattern.

15. A method of fabricating a liquid crystal display device, the method comprising:

forming a gate material, an insulating material, a semiconductor material, and an ohmic contact material on a first substrate;

forming a first photoresist pattern on the ohmic contact material, removing the ohmic contact material, the semiconductor material, and the insulating material using the first photoresist pattern as a mask to form a first ohmic contact material pattern, a semiconductor material pattern and a first gate insulating layer, wherein after the removing of the ohmic contact material, the semiconductor material, and the insulating material, a stacked structure of the first gate insulating layer, the semiconductor material pattern, the first ohmic contact material pattern and the first photoresist pattern is formed on the gate material; and over-etching the gate material using the stacked structure of the first ohmic contact material pattern, the semiconductor material pattern, the first gate insulating layer, and the first photoresist pattern as a mask, thereby forming a gate transmitting member of which a side surface is spaced apart from a side surface of the first gate insulating layer.

16. The method of claim 15, wherein the first gate insulating layer has a size greater than a size of the gate transmitting member.

17. The method of claim 15, wherein the first photoresist pattern comprises first and second patterns having different thickness from one another, the first pattern being integrally formed with the second pattern.

18. The method of claim 17, further comprising:

removing the first pattern having a smaller thickness than the second pattern;

removing the semiconductor material pattern and the first ohmic contact material pattern using the second pattern of the first photoresist pattern as a mask, and forming a semiconductor layer and a second ohmic contact material pattern; and forming a data transmitting member overlapping the semiconductor layer and a pixel electrode connected to the data transmitting member.

19. The method of claim 15, wherein the removing of the ohmic contact material, the semiconductor material, and the insulating material is performed using a dry-etching method.

20. The method of claim 19, wherein the over-etching of the gate material is performed by using a wet-etching method.

* * * * *